(12) United States Patent
Otaka et al.

(10) Patent No.: US 11,009,531 B2
(45) Date of Patent: May 18, 2021

(54) IMAGE GENERATING METHOD, IMAGE GENERATING DEVICE, IMAGE GENERATING PROGRAM, AND STORAGE MEDIUM

(71) Applicant: HAMAMATSU PHOTONICS K.K., Hamamatsu (JP)

(72) Inventors: Akihiro Otaka, Hamamatsu (JP); Tomonori Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/841,782

(22) Filed: Apr. 7, 2020

(65) Prior Publication Data

US 2020/0241054 A1 Jul. 30, 2020

Related U.S. Application Data

(63) Continuation of application No. 15/770,536, filed as application No. PCT/JP2016/075983 on Sep. 5, 2016, now Pat. No. 10,656,187.

(30) Foreign Application Priority Data

Oct. 30, 2015 (JP) ................. 2015-214152

(51) Int. Cl.
*G01R 19/14* (2006.01)
*G01R 31/311* (2006.01)
(Continued)

(52) U.S. Cl.
CPC ............ *G01R 19/14* (2013.01); *G01N 21/41* (2013.01); *G01N 27/72* (2013.01); *G01R 31/2601* (2013.01); *G01R 31/311* (2013.01)

(58) Field of Classification Search
CPC .. G01R 19/14; G01R 31/2601; G01R 31/311; G01N 21/41; G01N 27/72
(Continued)

(56) References Cited

U.S. PATENT DOCUMENTS

| | | |
|---|---|---|
| 5,443,071 A | 8/1995 | Banjanin et al. |
| 5,574,368 A | 11/1996 | Horn et al. |

(Continued)

FOREIGN PATENT DOCUMENTS

| | | |
|---|---|---|
| CN | 1249535 A | 4/2000 |
| CN | 1536450 A | 10/2004 |

(Continued)

OTHER PUBLICATIONS

Iwanami, M. et al., "Magnetic Near-Field Distribution Measurements over Fine Meander Circuit Patterns by Fiber-Optic Maneto-Optic Probe," 2003 IEEE International Symposium on Electromagnetic Compatibility, Aug. 2003, vol. 1, pp. 347-352.
(Continued)

*Primary Examiner* — Nasima Monsur
*Assistant Examiner* — Rahul Maini
(74) *Attorney, Agent, or Firm* — Faegre Drinker Biddle & Reath LLP

(57) ABSTRACT

An image generating device is an apparatus for acquiring an image which shows a direction of an electric current flowing through a semiconductor device. The image generating device comprises a signal application unit configured to apply a stimulation signal to the semiconductor device, a magnetic detection unit configured to output a detection signal based on a magnetism generated by an application of the stimulation signal, and an image generation unit configured to generate phase image data comprising a phase component which indicates a phase difference based on the phase difference between the detection signal and a refer-
(Continued)

ence signal which is generated based on the stimulation signal and generate an electric current direction image which shows the direction of the electric current based on the phase image data.

13 Claims, 22 Drawing Sheets

(51) Int. Cl.
 *G01N 27/72* (2006.01)
 *G01N 21/41* (2006.01)
 *G01R 31/26* (2020.01)
(58) Field of Classification Search
 USPC .................................. 324/754.23; 356/36
 See application file for complete search history.

(56) References Cited

U.S. PATENT DOCUMENTS

| 6,141,093 | A | 10/2000 | Argyle et al. |
| 7,271,900 | B2 | 9/2007 | Decitre et al. |
| 7,825,673 | B2 | 11/2010 | Nikawa |
| 2005/0140367 | A1 | 6/2005 | Nikawa |
| 2006/0146328 | A1 | 7/2006 | Decitre et al. |
| 2009/0002000 | A1 | 1/2009 | Nikawa |

FOREIGN PATENT DOCUMENTS

| CN | 101354366 A | 1/2009 |
| CN | 103219346 A | 7/2013 |
| JP | S46-041157 B | 12/1971 |
| JP | H06-213976 A | 8/1994 |
| JP | H11-142453 A | 5/1999 |
| JP | 2005-134169 A | 5/2005 |
| JP | 2011-226804 A | 11/2011 |
| JP | 2012-008072 A | 1/2012 |
| WO | WO-2005/022180 A1 | 3/2005 |
| WO | WO-2016/129458 A1 | 8/2016 |

OTHER PUBLICATIONS

Pappas, D.P., "High Sensitivity Magnetic Field Sensor Technology overview," NIST, PSMM2008(1), 2008, 50 pages.
Roth, B. J. et al., "Using a magnetometer to image a two-dimensional current distribution," Journal of Applied Physics, vol. 65, No. 1, Jan. 1989, pp. 361-372.
International Preliminary Report on Patentability dated May 11, 2018 for PCT/JP2016/075983.

Fig.12A

| ANGLE | COLOR |
|---|---|
| $\pi$ | GREEN |
| $5\pi/6$ | GREEN |
| $2\pi/3$ | YELLOW |
| $\pi/2$ | YELLOW |
| $\pi/3$ | YELLOW |
| $\pi/6$ | RED |
| 0 | RED |
| $-\pi/6$ | RED |
| $-\pi/3$ | CYAN |
| $-\pi/2$ | CYAN |
| $-2\pi/3$ | CYAN |
| $-5\pi/6$ | GREEN |

Fig.12B

| ANGLE | COLOR |
|---|---|
| $\pi$ | CYAN |
| $5\pi/6$ | CYAN |
| $2\pi/3$ | GREEN |
| $\pi/2$ | GREEN |
| $\pi/3$ | GREEN |
| $\pi/6$ | YELLOW |
| 0 | YELLOW |
| $-\pi/6$ | YELLOW |
| $-\pi/3$ | RED |
| $-\pi/2$ | RED |
| $-2\pi/3$ | RED |
| $-5\pi/6$ | CYAN |

# IMAGE GENERATING METHOD, IMAGE GENERATING DEVICE, IMAGE GENERATING PROGRAM, AND STORAGE MEDIUM

CROSS-REFERENCE TO RELATED APPLICATIONS

This application is a continuation of U.S. patent application Ser. No. 15/770,536, filed Apr. 24, 2018, which is a 371 of International Application No. PCT/JP2016/075983, filed Sep. 5, 2016, which claims the benefit of Japanese Patent Application No. 2015-214152, filed Oct. 30, 2015, the contents of each of which is incorporated herein by reference.

TECHNICAL FIELD

The present invention relates to an image generating method, an image generating device, an image generating program, and a recording medium.

BACKGROUND ART

In the related art, a detection device which detects an intensity of an electric current or a portion through which an electric current flows in a semiconductor device in order to inspect a semiconductor device is known. For example, Patent Literature 1 discloses a non-destructive analysis device which detects magnetism induced by an electric current generated from a semiconductor device using a magnetic detector (superconducting quantum interference device: SQUID). In the non-destructive analysis device, the semiconductor device is irradiated with a modulation beam of which the intensity is modulated by a modulation signal synchronized with a reference signal. In addition, a phase difference image is obtained on the basis of a detection signal which is output from the magnetic detector and the reference signal. In addition, Non Patent Literature 1 discloses a method of obtaining an electric current density in a plane direction from a magnetic flux density which is detected by a magnetic detector such as a SQUID. Non Patent Literature 1 proposes a method of obtaining the electric current density from a magnetic field by formulating a relation between an electric current and the magnetic field using the Biot-Savart law.

CITATION LIST

Patent Literature

[Patent Literature 1] Japanese Unexamined Patent Publication No. 2005-134196

Non Patent Literature

[Non Patent Literature] Bradley J. Roth, Nestor G Sepulveda, and John P. Wikswo, Jr., "Using a magnetometer to image a two-dimensional current distribution," J. Appl. Phys., 65 (1), 1 Jan. 1989.

SUMMARY OF INVENTION

Technical Problem

However, Patent Literature 1 merely distinguishes a difference between a good product and a defective product with a high sensitivity using the phase difference image. In addition, Non Patent Literature 1 merely discloses a theoretical formula for obtaining the electric current density from the magnetic field. As described above, neither literature discloses a method or the like of obtaining a direction of an electric current flow in a semiconductor device. Therefore, an aspect of the present invention is to provide an image generating method and an image generating device capable of generating an electric current direction image which is an image showing a direction of an electric current in a semiconductor device.

Solution to Problem

An image generating method according to an aspect is an image generating method of generating an image which shows a direction of an electric current flowing through a semiconductor device. The image generating method includes a step of applying a stimulation signal to the semiconductor device, a step of detecting a magnetism generated by the application of the stimulation signal and outputting a detection signal, a step of generating phase image data including a phase component which indicates a phase difference based on the phase difference between the detection signal and a reference signal which is generated based on the stimulation signal, and a step of generating an electric current direction image which shows the direction of the electric current based on the phase image data.

In addition, an image generating device according to an aspect is an image generating device for acquiring an image which shows a direction of an electric current flowing through a semiconductor device. The image generating device includes a signal application unit configured to apply a stimulation signal to the semiconductor device, a magnetic detection unit configured to output a detection signal based on a magnetism generated by the application of the stimulation signal, and an image generation unit configured to generate phase image data including a phase component which indicates a phase difference based on the phase difference between the detection signal and a reference signal which is generated based on the stimulation signal and generate an electric current direction image which shows the direction of the electric current based on the phase image data.

In addition, an image generating program according to an aspect is a program which causes a computer to execute a process of acquiring an image showing a direction of an electric current flowing through a semiconductor device by applying a stimulation signal to the semiconductor device. The image generating program causes a computer to function as a phase image data generation unit configured to generate phase image data including a phase component which indicates a phase difference from the phase difference between a detection signal based on a magnetism generated by the application of the stimulation signal and a reference signal generated based on the stimulation signal, and an image generation unit configured to generate an electric current direction image which shows the direction of the electric current based on the phase image data. In addition, a recording medium according to another aspect is a computer-readable recording medium which records the image generating program.

According to the image generating method, the image generating device, and the image generating program, the magnetism is generated by the stimulation signal applied to the semiconductor device. In addition, the phase image data including the phase component showing the phase difference is generated based on phase difference between the reference signal generated based on the stimulation signal and the detection signal based on the magnetism. Since the phase difference changes with a direction of a magnetic field, the phase image data includes information on the direction of the magnetic field. Since the direction of the magnetic field is determined by the direction of the electric current, it is possible to determine the direction of the electric current based on the phase image data. Therefore, it is possible to generate the image which shows the direction of the electric current by using the determined direction of the electric current.

In an embodiment, the electric current direction image may be configured to show the direction of the electric current in a plurality of colors set according to the direction. With this configuration, it is possible to visually ascertain the position and the direction of the electric current easily.

In an embodiment, the plurality of colors may be configured to have different colors set with respect to each of at least four angle ranges divided to correspond to the direction of the electric current. In general, an electric current path in the semiconductor device is often designed in an X-axis direction and a Y-axis direction in a plan view. In this case, the directions of the electric current are four in an X direction, a −X direction, a Y direction, and a −Y direction. With the at least four different colors of the above described configuration, it is easy to distinguish the four directions.

In an embodiment, the step of generating the electric current direction image may include a step of changing a correspondence relationship between the direction of the electric current and the plurality of colors. For example, the image generation unit may have a color table including data of the plurality of colors and an angle table including data of the angle ranges divided to correspond to the direction of the electric current. The image generation unit may be configured to change a correspondence relationship between the color table and the angle table. With this configuration, for example, even in a case in which a direction of an obtained image is tilted, it is possible to easily adjust a color arrangement.

In an embodiment, the image generating method may further include a step of generating data in which magnetism direction data based on the phase image data is added to intensity image data indicating an intensity of the magnetism generated from the detection signal and generating an electric current intensity image showing an intensity of the electric current based on the data. In this case, the image generating method may further include a step of generating an electric current image showing the intensity and the direction of the electric current based on the electric current intensity image and the electric current direction image. In this case, the image generation unit may be configured to generate data in which magnetism direction data based on the phase image data is added to intensity image data indicating an intensity of the magnetism generated from the detection signal and generate an electric current intensity image showing an intensity of the electric current based on the data. The intensity of the magnetism corresponds to the magnitude of the electric current. Therefore, it is possible to express the magnitude of the electric current in an image by adding the magnetism direction data to the intensity image data.

In an embodiment, the step of generating the electric current direction image showing the direction of the electric current may include a step of generating data in which magnetism direction data based on the phase image data is added to intensity image data indicating an intensity of the magnetism generated from the detection signal and generating an electric current direction image based on the corresponding data. In this case, the image generation unit may generate the data in which the magnetism direction data based on the phase image data is added to the intensity image data indicating the intensity of the magnetism generated from the detection signal and generate the electric current direction image based on the corresponding data. It is possible to obtain the electric current direction image showing the direction of the electric current more accurately by using the data including both the phase component and information on the intensity of the magnetism.

In an embodiment, the magnetic detection unit may include a light source which generates light, a magneto-optical crystal which is disposed to face the semiconductor device, an irradiation optical system which irradiates the magneto-optical crystal with the light and guides light reflected from the magneto-optical crystal, and a light detector which detects the light reflected from the magneto-optical crystal and outputs the detection signal.

Advantageous Effects of Invention

According to the image generating method and the image generating device, it is possible to generate the electric current direction image which is the image showing the direction of the electric current in the semiconductor device.

BRIEF DESCRIPTION OF DRAWINGS

FIGS. 12A and 12B are tables showing a relationship between an angle and a color.

DESCRIPTION OF EMBODIMENTS

Figure 1:
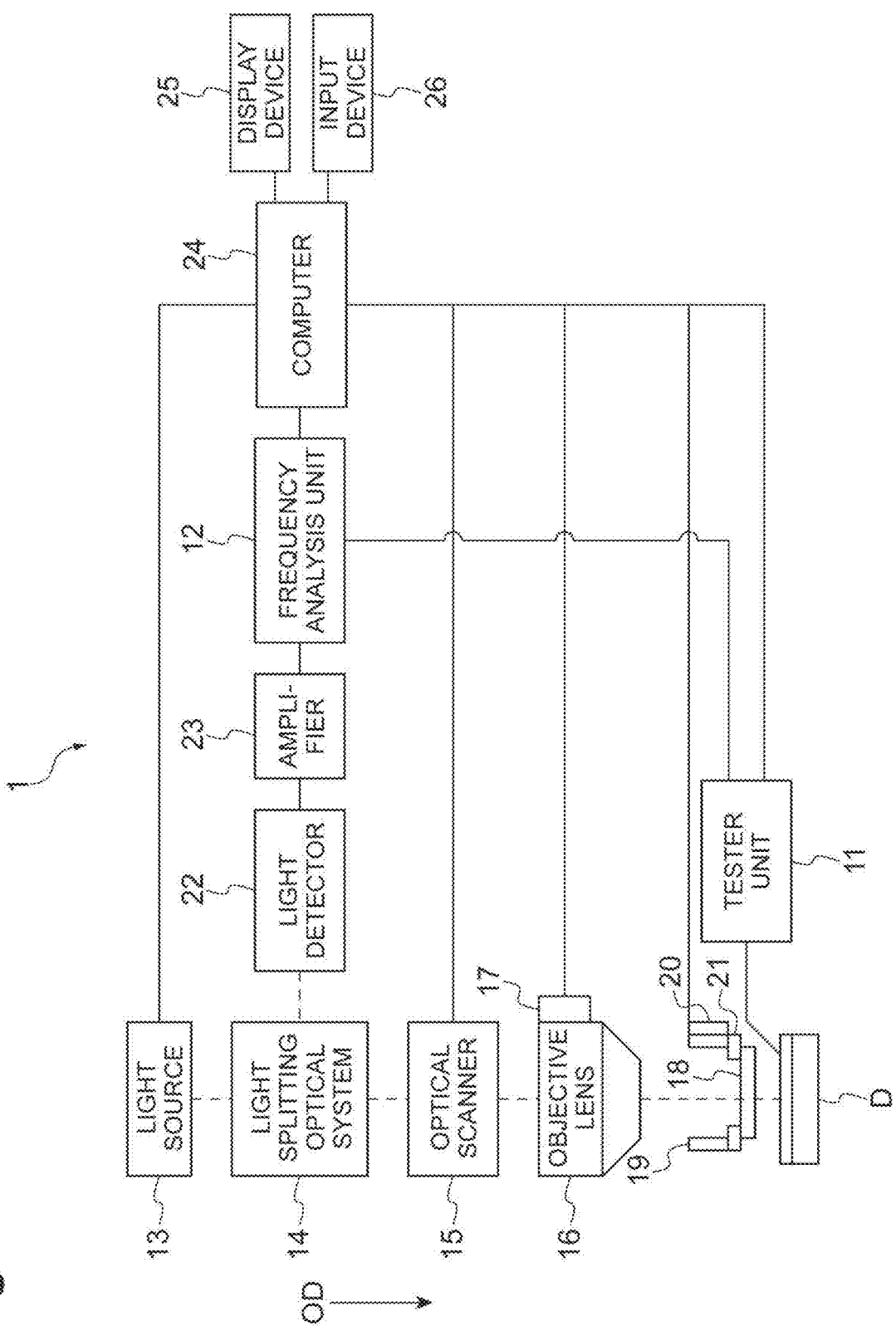
FIG. 1 is a configuration diagram of an inspection apparatus according to a first embodiment of the present invention.

Hereinafter, embodiments of the present invention will be described in detail with reference to the drawings. In addition, in the drawings, the same reference numerals are given to the same or equivalent parts and repetitive descriptions are omitted.

As illustrated in FIG. 1, for example, an image generating device 1 according to the present embodiment may be used in inspecting a semiconductor device D, such as specifying an abnormality occurrence portion in the semiconductor device D. The image generating device 1 obtains the direction of an electric current flowing through the semiconductor device D by applying a stimulation signal to the semiconductor device D and generates an image showing the direction of the electric current flowing through the semiconductor device D.

As the semiconductor device D, there are an integration circuit having a PN junction such as a transistor (for example, small scale integration (SSI), medium scale integration (MSI), large scale integration (LSI), very large scale integration (VLSI), ultra large scale integration (ULSI), giga scale integration (GSI)), high current/high voltage MOS transistors and bipolar transistors, and a power semiconductor device (power device). In addition, the semiconductor device D may be a package, a complex substrate, or the like including a semiconductor device.

A tester unit 11 (signal application unit) is electrically connected to the semiconductor device D via a device control cable. The tester unit 11 is operated by a power source (not shown) and applies a predetermined modulation electric current signal (stimulation signal) to the semiconductor device D. In the semiconductor device D, a modulation magnetic field is generated according to the modulation electric current signal. By detecting light of which the intensity is modulated according to the modulation electric field by a light detector 22 which will be described later, it is possible to detect light modulated at a specific frequency. In addition, lock-in detection may be performed by generating light from a light source 13 (described later) according to the detection frequency while applying the modulation electric current signal from the tester unit 11 to the semiconductor device D, and in this case, it is possible to improve S/N. The tester unit 11 is electrically connected to a frequency analysis unit 12 via a timing signal cable. In addition, a modulation voltage signal may be applied as the stimulation signal. Furthermore, instead of the tester unit, a pulse generator or the like may be used as the signal application unit.

The image generating device 1 includes the light source 13. The light source 13 is operated by a power source (not shown), and generates and outputs CW light or pulse light to be irradiated to an MO crystal 18 (magneto-optical crystal) which will be described later and the semiconductor device D. The light output from the light source 13 may be incoherent light or coherent light such as laser light. As the light source 13 which outputs the incoherent light, a super luminescent diode (SLD), an amplified spontaneous emission (ASE), a light emitting diode (LED), or the like may be used. In a case in which the light output from the light source 13 is the incoherent light, it is possible to reduce interference noise generated between reflected light in the MO crystal 18 and reflected light in the semiconductor device D. The reflected light in the MO crystal 18 includes both reflected light on a light incident surface of the MO crystal 18 and reflected light on a light reflection surface of the MO crystal 18. In addition, an influence of the reflected light on the light incident surface of the MO crystal 18 may be reduced by carrying out antireflection processing on the light incident surface.

In addition, as the light source 13 which outputs the coherent light, a solid laser light source, a semiconductor laser light source, or the like may be used. The wavelength of the light output from the light source 13 is 530 nm or more, preferably 1064 nm or more. The light output from the light source 13 is guided to a light splitting optical system 14 via a polarization preserving single mode optical coupler (not shown) and a polarization preserving single mode optical fiber for probe light. Details of the light splitting optical system 14 will be described later. The light guided from the light source 13 to the light splitting optical system 14 is further guided to an irradiation optical system including an optical scanner 15 and an objective lens 16. The optical scanner 15 and the objective lens 16, which are irradiation optical systems, irradiate the MO crystal 18 with the light output from the light source 13.

The optical scanner 15 scans an irradiation spot on the light incident surface of the MO crystal 18. More specifically, the optical scanner 15 is controlled by a computer 24 which will be described later, and thus the optical scanner 15 scans the irradiation spot. For example, the optical scanner 15 is configured by an optical scan element such as a galvanometer mirror, a micro electro mechanical system (MEMS) mirror, a polygon mirror, or the like.

The objective lens 16 condenses the light guided by the optical scanner 15 to the MO crystal 18. The objective lens 16 is configured to be capable of switching a low magnification objective lens and a high magnification objective lens by a turret (not shown) or the like. The magnification of the low magnification objective lens is, for example, 5 times, and the magnification of the high magnification objective lens is, for example, 50 times. An objective lens drive unit 17 is connected to the objective lens 16. The objective lens drive unit 17 is moved in the optical axis direction OD of the light from the light source 13, and thus it is possible to adjust the focal position of the objective lens 16.

The MO crystal 18 is disposed to face the semiconductor device D. The MO crystal 18 changes the refractive index according to the electric field generated in the semiconductor device D by the magneto-optical effect, and changes a polarization state (polarization direction) of the incident light. For example, in a case in which a modulation electric current signal is applied to the semiconductor device D at the time of a failure of the semiconductor device D, or the like, an electric current path through which a leakage current according to a failure location flows occurs in some cases. In this case, in the location where the leakage electric current occurs, a magnetic field different from that of a position where the leakage electric current does not occur is generated. The MO crystal 18 emits reflected light of which the polarization direction changes according to such a change of the magnetic field. The difference of the polarization direction of the reflected light is expressed as a difference of the intensity of the light acquired by the light detector 22 which will be described later. The reflected light in the MO crystal 18 is returned to the light splitting optical system 14 via the objective lens 16 and the optical scanner 15 and guided to the light detector 22 via an optical fiber for returned light. With this configuration, a magnetic detection unit for detecting magnetism is configured.

A holder 19 for holding the MO crystal 18 is connected to the MO crystal 18 via a flexible member 21. For example, the flexible member 21 is a ring shape elastic member including rubber, a spring, or the like. In addition, the flexible member 21 may be a member of which the shape is deformed, and may not necessarily be an elastic member. The flexible member 21 is fixed to the MO crystal 18 to cover at least a part of an outer edge of the MO crystal 18 in a view from the optical axis direction OD. The flexible member 21 is fixed to a light incident surface side of the MO crystal 18. In addition, the holder 19 is, for example, a ring shape and is fixed to the flexible member 21 to cover an outer edge of the flexible member 21 in a view from the optical axis direction OD. Therefore, one surface of the flexible member 21 is fixed to the MO crystal 18 and another surface of the flexible member 21 is fixed to the holder 19. Since the flexible member 21 of the ring shape covers the outer edge of the MO crystal 18 and the holder 19 of the ring shape covers the outer edge of the flexible member 21, in the view from the optical axis direction OD, an opening for receiving the light from the objective lens 16 is formed on the light incident surface of the MO crystal 18. A holder drive unit 20 is connected to the holder 19.

The holder drive unit 20 is moved in the optical axis direction OD to move the holder 19 in the optical axis direction OD. Since the holder drive unit 20 is moved in the optical axis direction OD, the distance between the holder 19 and the semiconductor device D is shortened, and the MO crystal 18 is pressed to the semiconductor device D. That is, the MO crystal 18 is able to be brought into contact with the semiconductor device D. The light irradiation on the MO crystal 18 is performed in a state in which the MO crystal 18 is in contact with the semiconductor device D. In addition, the light irradiation on the MO crystal 18 is not limited to being performed in the state in which the MO crystal 18 is in contact with the semiconductor device D, and may be performed in a state in which there is a predetermined interval between the MO crystal 18 and the semiconductor device D. In addition, the objective lens drive unit 17 and the holder drive unit 20 may be configured as an integrated type. In this case, the integrated type configuration may have a mechanism for individually moving the objective lens 16 and the holder 19.

The light detector 22 detects the reflected light from the MO crystal 18 in contact with the semiconductor device D according to the irradiated light and outputs a detection signal. For example, the light detector 22 is a photodiode, an avalanche photodiode, a photomultiplier tube, an area image sensor, or the like. The light detector 22 includes at least one detector and detects the intensity of the light input to the detector.

Figure 2:
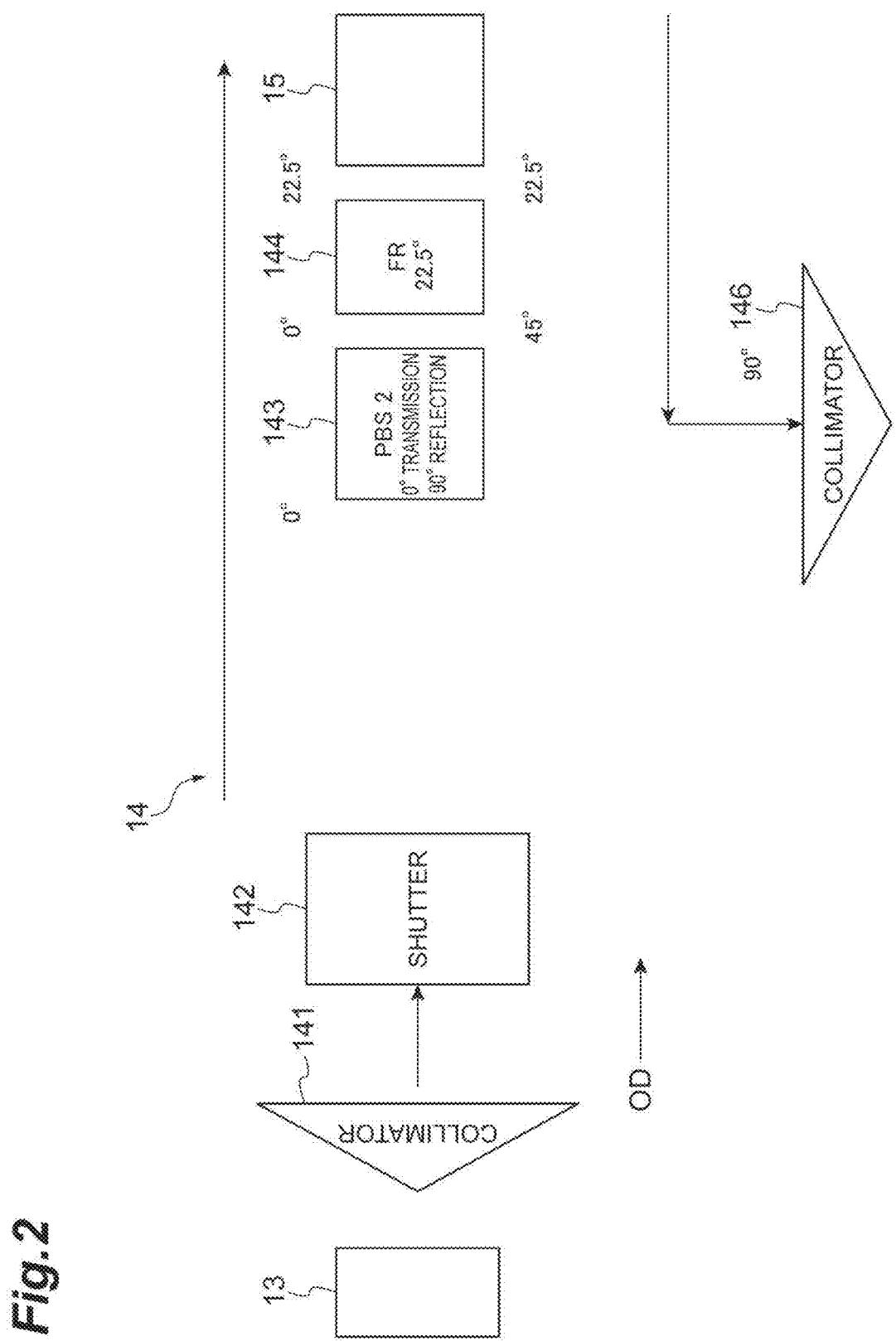
FIG. 2 is a diagram for describing a light splitting optical system in the inspection apparatus of FIG. 1.

Here, the light splitting optical system 14 will be described with reference to FIG. 2. The light splitting optical system 14 includes collimators 141 and 146, a shutter 142, a polarization beam splitter (PBS) 143, and a faraday rotator (FR) 144. As illustrated in FIG. 2, in a case in which the MO crystal 18 is irradiated with the light from the light source 13 via the optical scanner 15, the light from the light source 13 is first input to the shutter 142 via the collimator 141. The shutter 142 may be an element capable of controlling ON/OFF of the light. In addition, the light output from the shutter 142 is input to the PBS 143. The PBS 143 is set to transmit light having a polarization component of 0 degrees and reflect light having a polarization component of 90 degrees. In addition, the PBS 143 is set appropriately for the polarization of the light from the shutter 142. Therefore, the PBS 143 transmits the light from the shutter 142. The light having the polarization component of 0 degrees transmitted through the PBS 143 is input to the FR 144 of which a polarization plane of incident light is tilted (rotated) 22.5 degrees, and a polarization component thereof is 22.5 degrees. The light transmitted through the FR 144 is input to the optical scanner 15 as the light having the polarization component of 22.5 degrees. The MO crystal 18 is irradiated with the light.

The polarization plane of the reflected light from the MO crystal 18 rotates according to the magneto-optical effect (Kerr effect, Faraday effect, or the like) proportional to the magnetic field (magnetic field intensity) which is generated by the modulation electric current signal applied to the semiconductor device D. The reflected light is tilted 22.5 degrees in the polarization plane by the FR 144 and input to the PBS 143. The reflected light is divided into light having a polarization component of 90 degrees and light having a polarization component of 0 degrees by the PBS 143. The light having the polarization component of 90 degrees is reflected by the PBS 143 and input to the light detector of the light detector 22 via the collimator 146. As described above, the light detector 22 detects the change in the polarization plane according to the magnetic field (magnetic field intensity) generated in the semiconductor device D as the light intensity, and outputs the detection signal of the intensity (amplitude) according to the light intensity to an amplifier 23. In addition, although the configuration in which only one PBS 143 is provided as the light splitting optical system 14 and only the light having the polarization component of 90 degrees is detected among linearly polarized light which is orthogonal has been described, the present invention is not limited thereto. That is, the light splitting optical system 14 may further include an FR which inclines the polarization plane of the incident light 45 degrees between the PBS 143 and the FR 144, a PBS which transmits light having a polarization component of 45 degrees and reflects light having a polarization component of 135 degrees, and a collimator, and may capture and perform difference detection on the both orthogonal linearly polarized light, that is, the light having the polarization component of 0 degrees and the light having the polarization component of 90 degrees. In addition, a half mirror may be used as the light splitting optical system 14.

Returning to FIG. 1, the amplifier 23 amplifies the detection signal output by the light detector 22 and outputs the amplified detection signal. The amplified detection signal is input to the frequency analysis unit 12. As the frequency analysis unit 12, a lock-in amplifier, a spectrum analyzer, a digitizer, a Cross Domain Analyzer (registered trademark), a network analyzer, a digitizer, or the like is used. The frequency analysis unit 12 extracts a measurement frequency component in the amplified detection signal. For example, the measurement frequency is set on the basis of a modulation frequency of the modulation electric current signal applied to the semiconductor device D. In addition, the frequency analysis unit 12 acquires a reference signal of which the period is equal to that of the modulation electric current signal applied to the semiconductor device D. For example, the reference signal is output from the tester unit 11 and input to the frequency analysis unit 12.

Figure 3:
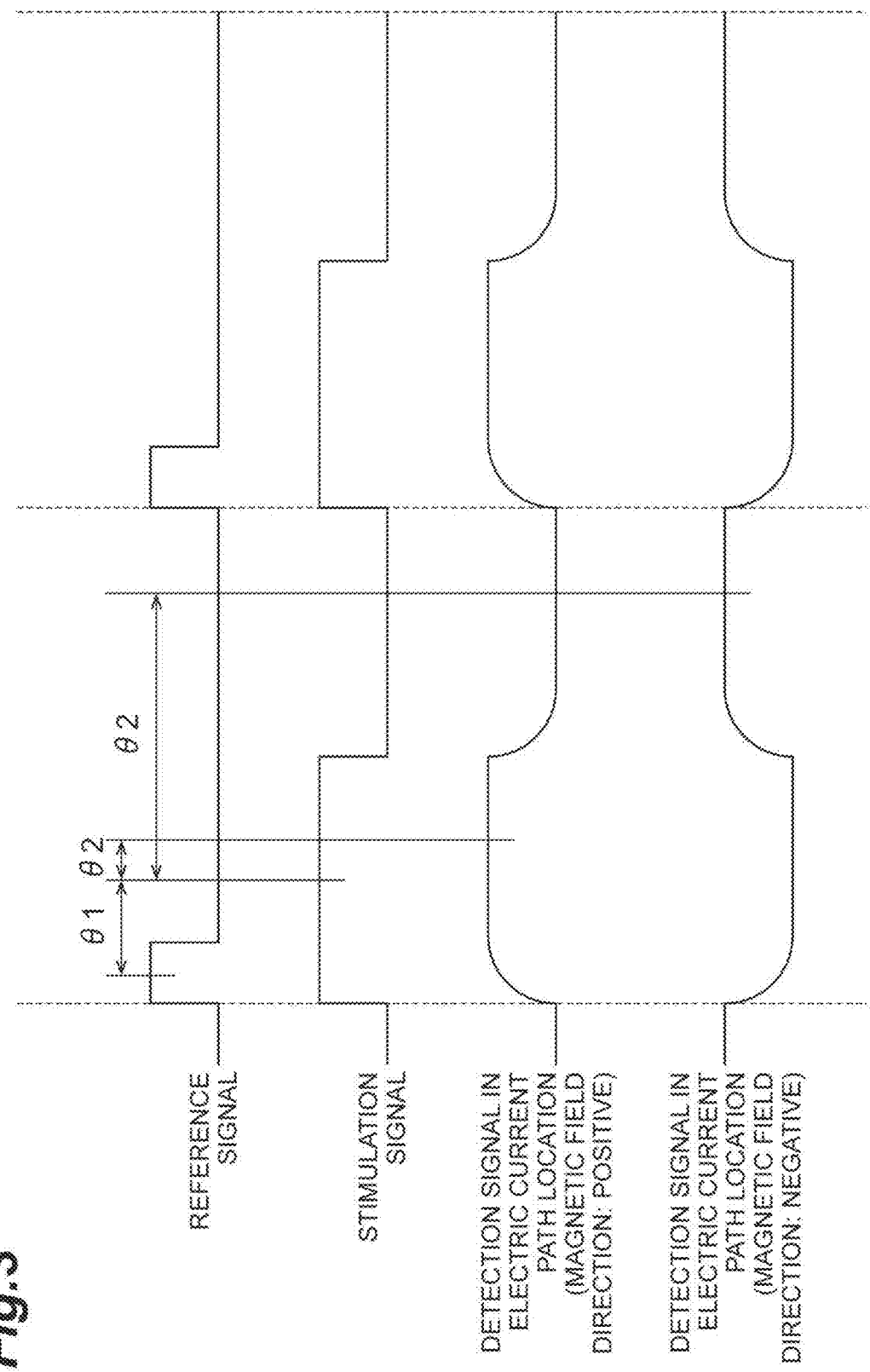
FIG. 3 is a diagram for describing a phase difference.

The frequency analysis unit 12 derives a phase difference between the detection signal from which the measurement frequency component is extracted and the acquired reference signal. As described above, the amplitude of the detection signal changes according to the magnetic field (magnetic field intensity) generated in the semiconductor device D. In addition, the frequency analysis unit 12 may specify the phase difference between the detection signal and the reference signal on the basis of the amplitude of the detection signal. Here, the phase difference between the detection signal related to the reflected light of an electric current path location and the reference signal is a specific value. Specifically, the specific value is substantially one of two values according to whether direction in which the magnetic field generated according to the electric current penetrates the MO crystal 18 is positive or negative. As illustrated in FIG. 3, the period of the reference signal is equal to that of the stimulation signal by the frequency analysis unit 12. In addition, the phase difference (hereinafter referred to as electric current phase difference in some cases) between the detection signal of the electric current path location and the reference signal is constant during a plurality of periods. Specifically, the electric current phase difference is a value obtained by adding a phase difference θ1 between the reference signal and the stimulation signal and a phase difference θ2 between the stimulation signal and the detection signal. The phase difference θ1 may be changed according to a setting of the frequency analysis unit 12 which generates the reference signal. In order to more easily obtain the electric current phase difference, it is preferable that the phase of the reference signal be equal to that of the stimulation signal and the phase difference θ1 be 0. The phase difference θ2 is one of two values which differ by 180 degrees (π) according to whether the direction in which the magnetic field generated according to the electric current penetrates the MO crystal is positive or negative. That is, the phase difference θ2 between the detection signal of the electric current path location where the magnetic field direction is positive and the stimulation signal differs from the phase difference θ2 between the detection signal of the electric current path location where the magnetic field direction is negative and the stimulation signal by 180 degrees (π). On the other hand, the phase difference between the detection signal of a location other than the electric current path location in the semiconductor device D and the reference signal is not a specific value but is a random value. The frequency analysis unit 12 outputs an analysis signal including information indicating the specified phase difference to the computer 24 (image generation unit). In addition, the frequency analysis unit 12 outputs the detection signal of an intensity (amplitude) according to the light intensity, which is input from the amplifier 23, to the computer 24.

The computer 24 is, for example, a PC or the like. An input device 26 such as a keyboard or a mouse to which a measurement condition and the like are input by the user and a display device 25 such as a display for displaying a measurement result and the like to the user are connected to the computer 24. The computer 24 includes a central processing unit (CPU) which is a processor, a random access memory (RAM) or a read only memory (ROM) which is a recording medium, and an input/output module. The computer 24 is electrically connected (coupling) to the light source 13, the optical scanner 15, the objective lens drive unit 17, the tester unit 11, the light detector 22, the frequency analysis unit 12, and the like via the input/output module, and performs a function of controlling such elements by the CPU.

Figure 4:
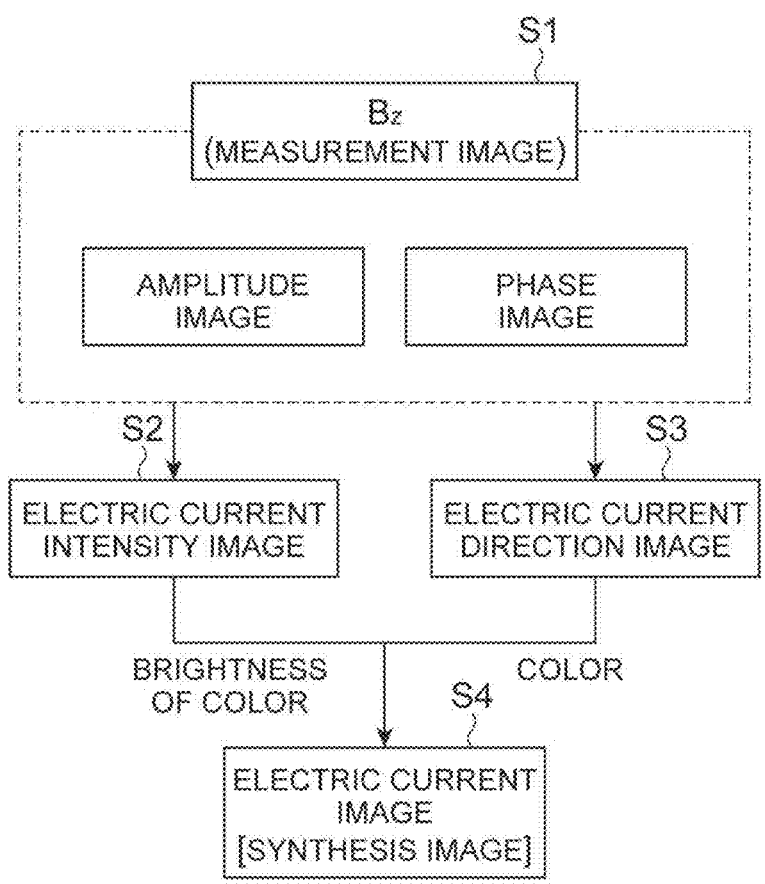
FIG. 4 is a diagram for describing an outline of a procedure for obtaining an electric current image.

The computer 24 generates an amplitude image, a phase image, an electric current intensity image, an electric current direction image, and an electric current image by executing an image generating program P1 (described later), which is recorded in the recording medium, by the CPU. As illustrated in FIG. 4, the computer 24 first generates the amplitude image (intensity image) and the phase image on the basis of measurement data (step S1). In the present embodiment, the measurement data includes data of the detection signal detected from the light detector 22 and data of the analysis signal output from the frequency analysis unit 12. In addition, the amplitude image shows the intensity (magnetic flux density) of the magnetic field and the phase image shows the direction of the magnetic field. Next, the computer 24 generates the electric current intensity image showing the intensity (electric current density) of the electric current on the basis of the amplitude image and the phase image (step S2). For example, in the electric current intensity image, the intensity of the electric current is shown by brightness (luminance). In addition, the computer 24 generates the electric current direction image showing the direction of the electric current on the basis of the amplitude image and the phase image (step S3). For example, in the electric current direction image, the direction of the electric current is shown by a color. Next, the computer 24 generates the electric current image showing the intensity and the direction of the electric current on the basis of the electric current intensity image and the electric current direction image (step S4).

A method of generating the amplitude image, the phase image, the electric current intensity image, and the electric current direction image, and the electric current image will be specifically described below.

[Generation of Amplitude Image]

Figure 5:
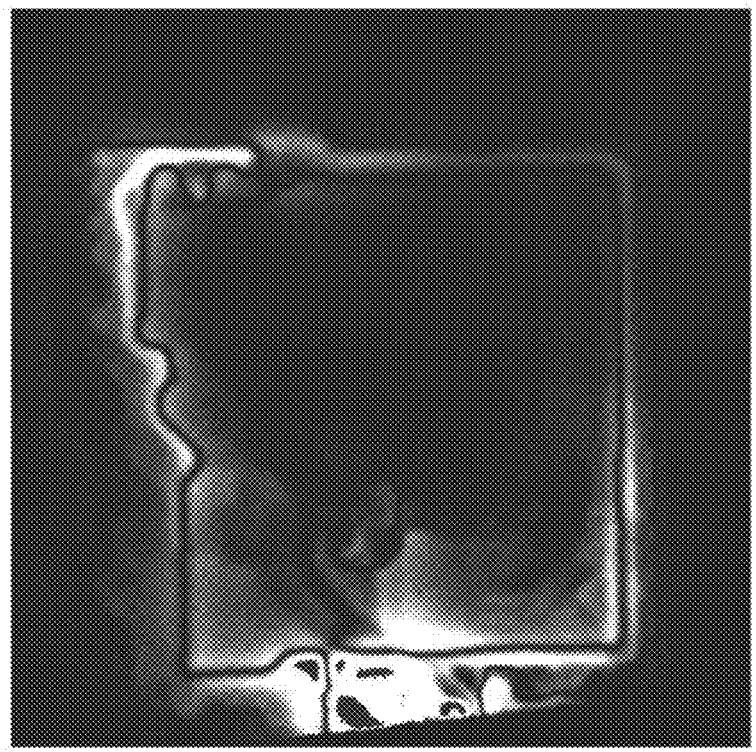
FIG. 5 is an image showing an example of an intensity image.

The computer 24 maps the light intensity on each irradiation spot on the basis of the light intensity (amplitude) of the detection signal and information on the irradiation spot on the light incident surface of the MO crystal 18 and generates the amplitude image. The amplitude image is an image obtained by mapping the light intensity on a predetermined luminance value according to the light intensity. Therefore, although the amplitude image shows the intensity of the magnetic field (magnetic flux density), the amplitude image does not show the direction of the magnetic field. Regarding the correspondence relationship between the light intensity and the luminance value, for example, in a case in which the light intensity is 0, the luminance value is set to 0 a.u., and in a case in which the light intensity is the maximum, the luminance value is set to 32000 a.u. That is, as illustrated in FIG. 5, in the amplitude image, the larger the intensity of the magnetic field is, the closer the color of the amplitude image is to white, and the smaller the intensity of the magnetic field is, the closer the color of the amplitude image is to black. The computer 24 generates amplitude image data including the light intensity corresponding to each irradiation spot. In the amplitude image data, the light intensity corresponding to each irradiation spot is mapped on the position (reference pixel) of the image in which the position of each irradiation spot is considered.

[Generation of Phase Image]

Figure 6:
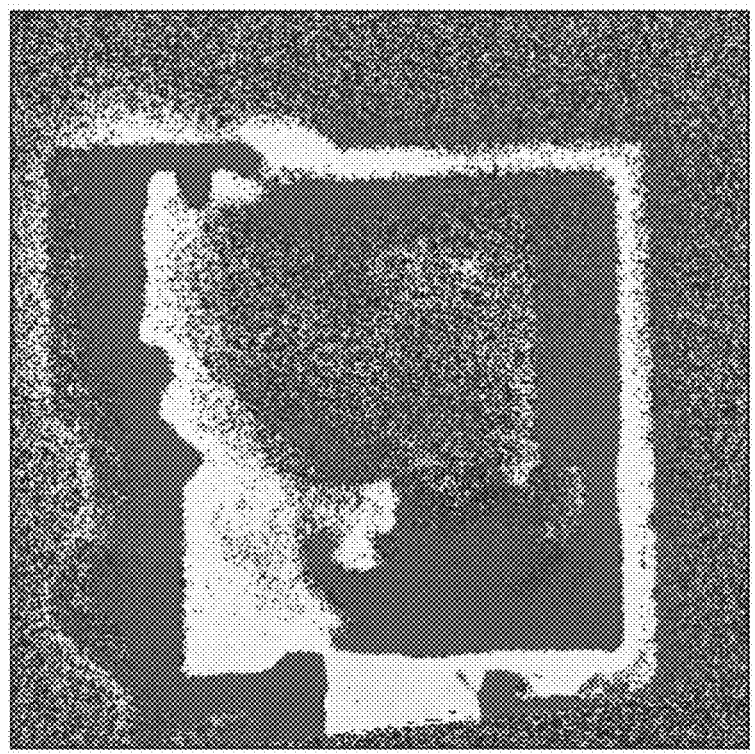
FIG. 6 is an image showing an example of a phase image.

The computer 24 maps the phase component on each irradiation spot on the basis of the phase difference (phase component) included in the analysis signal and information on the irradiation spot on the light incident surface of the MO crystal 18 and generates the phase image. The phase image is an image obtained by mapping the phase difference on a predetermined luminance value according to the phase difference. Regarding the correspondence relationship between the phase difference and the luminance value, for example, in a case in which the phase difference is −π, the luminance value is set to 0 a.u., in a case in which the phase difference is 0, the luminance value is set to 16000 a.u., and in a case in which the phase difference is +π, the luminance value is set to 32000 a.u. That is, as illustrated in FIG. 6, in the phase image, the phase image is colored black when the phase difference is closer to −π, and the phase image is colored white when the phase difference is closer to π. The computer 24 generates phase image data including a phase component corresponding to each irradiation spot. In the phase image data, the phase component corresponding to each irradiation spot is mapped on the position (reference pixel) of the image in which the position of each irradiation spot is considered.

[Generation of Electric Current Intensity Image and Electric Current Direction Image]

In the present embodiment, the electric current intensity image and the electric current direction image are generated on the basis of the Biot-Savart law shown as expression (1).

[Math. 1]

$$B(r) = \frac{\mu_0}{4\pi} \int \frac{J(r') \times (r - r')}{|r - r'|^3} d^3 r' \qquad (1)$$

Figure 7:
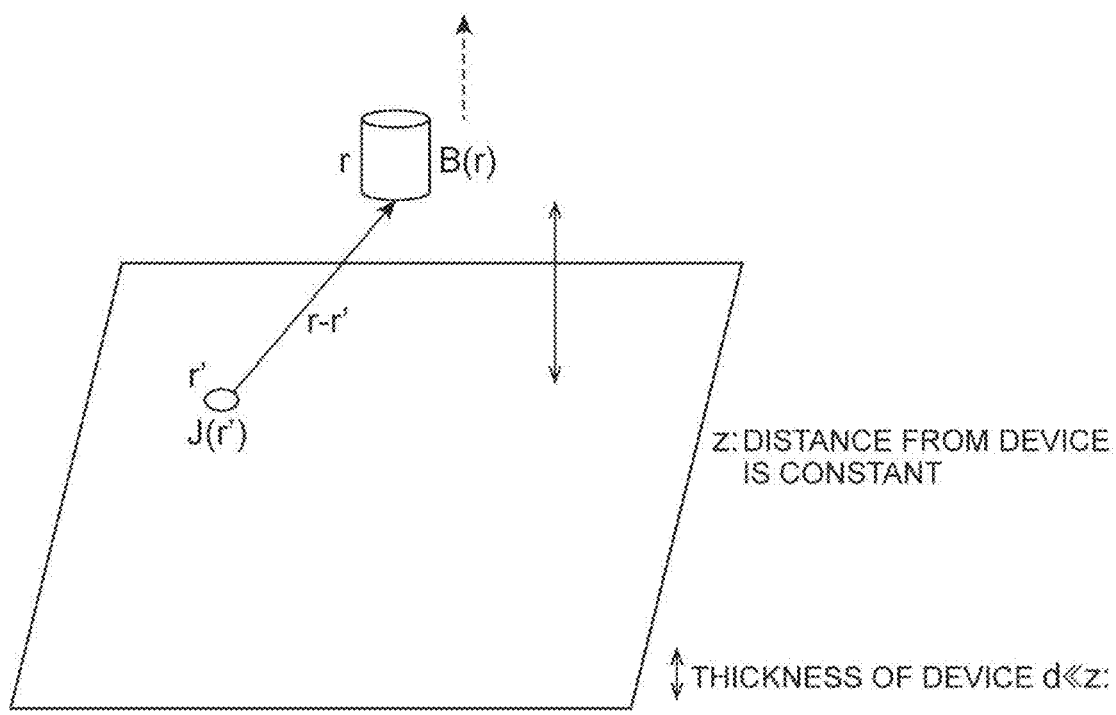
FIG. 7 is a diagram for describing a procedure for acquiring an electric current intensity image and an electric current direction image.

As illustrated in FIG. 7, a principle of generating the electric current intensity image and the electric current direction image using a semiconductor device having the thickness d as a model will be described. In the present example, a surface of the semiconductor device is defined as an xy plane and a thickness direction of the semiconductor device is defined as a z-axis (device surface is set to 0). The magnetic flux density at the position r(x, y, z) in a space is set to B(r). The position r is a constant distance in the z-axis direction from the surface of the device and the distance is set to be sufficiently smaller than the thickness d of the device. In addition, the electric current density at the point r'(x', y', 0) on the device surface influencing the magnetic field at the position r is set to J(r'). In this case, the magnetic flux density B(r), the electric current density J(r'), and the distance r-r' from the position r to the point r' become as illustrated in FIG. 7. In this model, only the z-axis magnetic flux at the position r is detected as the detection signal. Therefore, the Biot-Savart law is developed only in the z-axis direction and thus expression (2) is obtained.

[Math. 2]

$$B_z(x, y) = \frac{\mu_0 d}{4\pi} \int_{-\infty}^{\infty} \int_{-\infty}^{\infty} \frac{J_x(x', y') \cdot (y - y') - J_y(x', y') \cdot (x - x')}{((x-x')^2 + (y-y')^2 + z^2)^{3/2}} dx' dy' \qquad (2)$$

On the other hand, in a case in which it is considered that the electric current is stationary and there is no divergence or extinction, the sum of a surface electric current gradients is 0, and expression (3) and expression (4) are obtained.

[Math. 3]

$$\nabla \cdot J = \frac{\partial J_x}{\partial x} + \frac{\partial J_y}{\partial y} + \frac{\partial J_z}{\partial z} = 0 \qquad (3)$$

Figure 8:
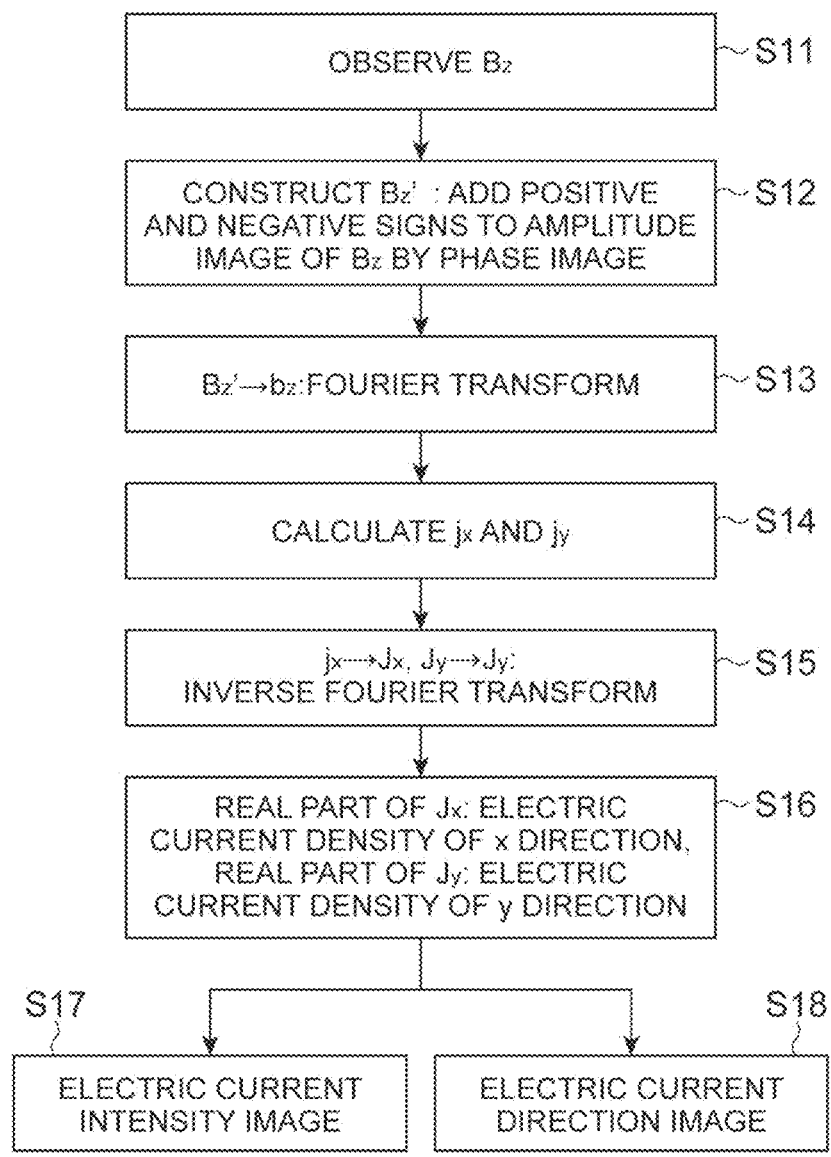
FIG. 8 is a diagram for describing a procedure for acquiring an electric current intensity image and an electric current direction image.

[Math. 4]

$$u j_x(u, v) + v j_y(u, v) = 0 \qquad (4)$$

u: angle frequency of x direction v: angle frequency of y direction $j_x$ (u, v): spectrum of x direction $j_y$ (u, v): spectrum of y direction Therefore, it is possible to calculate the electric current density J(r') by using expressions (2) and (4) and the measured magnetic flux density B(r). Hereinafter, a specific calculation flow will be described. As illustrated in FIG. 8, first, the computer 24 obtains the amplitude image as the magnetic flux density $B_z$ (absolute value) in the z-axis direction (step S11). Next, the computer 24 adds positive and negative signs to the amplitude image using the generated phase image and constructs a magnetic flux density $B_z'$ including information on the direction of the magnetic flux (step S12). In the present embodiment, for example, as shown in expression (5), in a case in which the amplitude value in the reference pixel is set to $A_p$ and the phase value is set to $P_p$, the positive and negative signs are added to the amplitude image of the corresponding reference pixel as "positive" in a region where the phase component of the phase image ranges from 0 to π and "negative" in a region where the phase component of the phase image ranges from −π to 0.

[Math. 5]

$$\text{sign}(P_p)A_p + i \cdot 0 = \text{sign}(P_p)A_p \qquad (5)$$

sign(arg):1(arg≥0),−1(arg<0)

Next, the computer 24 performs Fourier-transform the constructed magnetic flux density $B_z'$ and obtains a two-dimensional spectrum (step S13). In addition, by expression (4), the spectrum obtained in step S13 is decomposed into a spectrum $j_x$(u, v) in the x-axis direction and a spectrum $j_y$(u, v) in the y-axis direction (step S14). Next, the obtained spectrum $j_x$(u, v) and spectrum $j_y$(u, v) in the y-axis direction are performed inverse-Fourier-transform and the electric current density $J_x$ in the x-axis direction and the electric current density $J_y$ in the y-axis direction are obtained (step S15). Next, the real part of the obtained electric current density $J_x$ and the real part of the obtained electric current density $J_y$ are substituted into expression (6), and thus the electric current intensity image data is obtained (step S17). In the electric current intensity image data, the position information of each reference pixel and the electric current intensity at the corresponding position are linked. In addition, the real part of the obtained electric current density $J_x$ and the real part of the obtained electric current density $J_y$ are substituted into expression (7), and thus the electric current direction image data is obtained (step S18). In the electric current direction image data, the position information of each reference pixel and the electric current direction at the corresponding position are linked. The electric current direction is defined in a range of −π to π on the basis of an arbitrary direction on the plane in the reference pixel (in the embodiment, the right direction in the drawn image) set as a 0 degree direction.

[Math. 6]

$$\sqrt{J_x^2 + J_y^2} \quad (6)$$

[Math. 7]

$$\tan^{-1}\left(\frac{Re(J_y)}{Re(J_x)}\right) \quad (7)$$

In addition, in step S12, an I image (cosine image) and a Q image (sine image) may be constructed by the amplitude image and the phase image and may be performed Fourier-transform as $B_z'$. That is, in a case in which the amplitude value is set to $A_p$ and the phase value is set to $P_p$ in the reference pixel, the X image is calculated by expression (8) and the Q image is calculated by expression (9). The Fourier transform is a reversible mapping from a complex number to a complex number (so-called orthogonal transformation). Therefore, $I_p+iQ_p$ is set an input of Fourier transform as $B_z'$. As described above, by constructing $B_z'$, it is possible to hold information on a time phase. Therefore, it is possible to detect a phase delay.

[Math. 8]

$$I_p = A_p \cos P_p \quad (8)$$

$$-\pi \le P_p \le \pi$$

[Math. 9]

$$Q_p = A_p \sin P_p \quad (9)$$

$$-\pi \le P_p \le \pi$$

Figure 9:
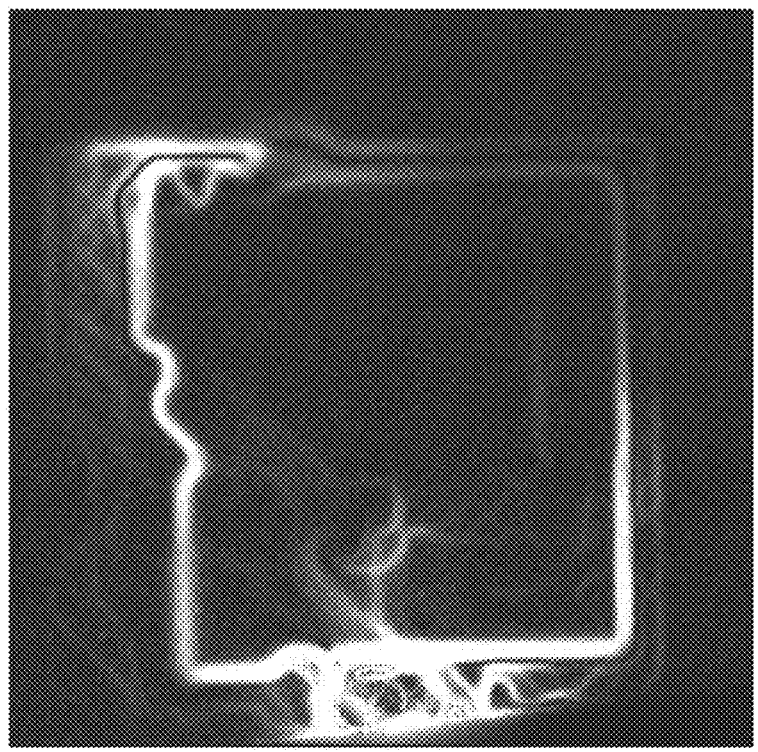
FIG. 9 is an image showing an example of the electric current intensity image.

The computer 24 maps the value of the electric current intensity image data for each reference pixel on the basis of the obtained electric current intensity image data and position information of the reference pixel and generates the electric current intensity image. The electric current intensity image of the present embodiment is an image obtained by mapping the electric current intensity with a predetermined luminance value according to the electric current intensity. With regard to the correspondence relationship between the electric current intensity and the luminance value, for example, in a case in which the luminance value is expressed with 16 bits, when the electric current intensity is 0, the luminance value is 0 a.u. and when the electric current intensity is the maximum, the luminance value is 65535 a.u. As illustrated in FIG. 9, in the electric current intensity image, the color of the electric current intensity image is close to white when the intensity (electric current density) of the electric current is higher.

Figure 10:
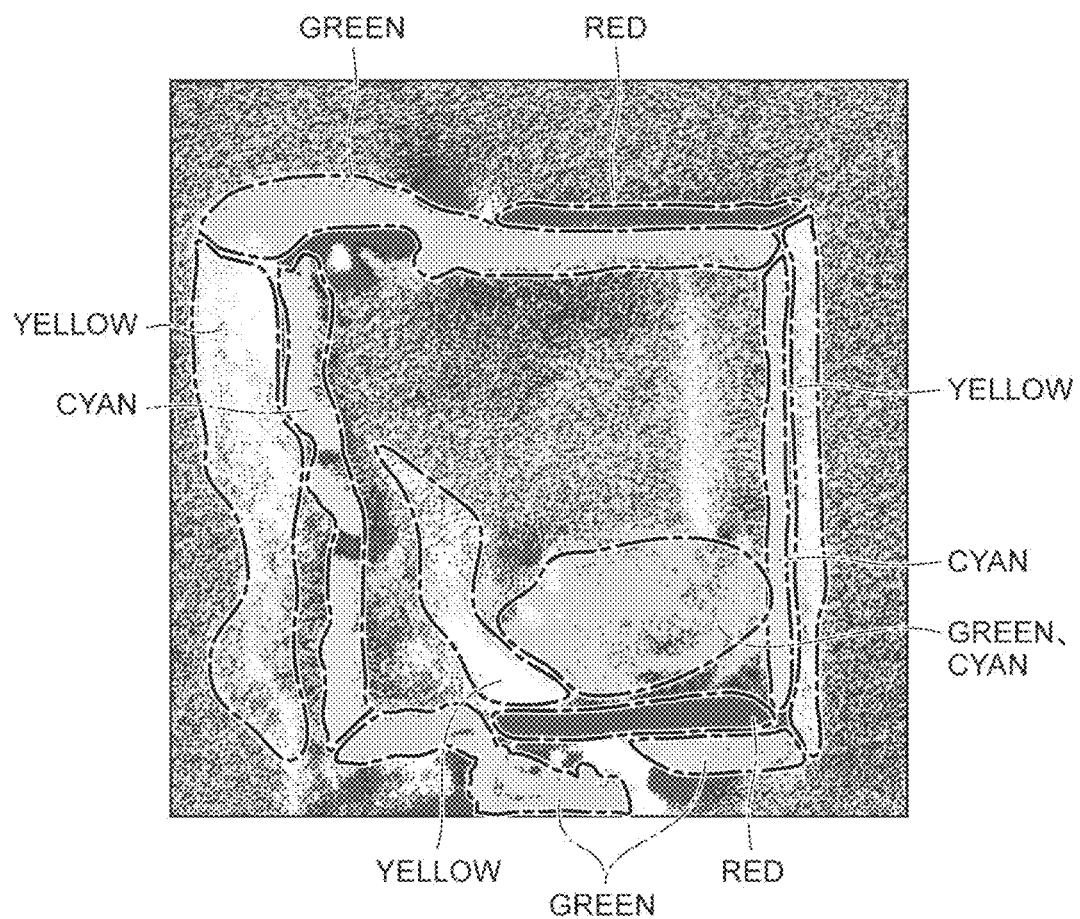
FIG. 10 is an image showing an example of the electric current direction image.
Figure 11:
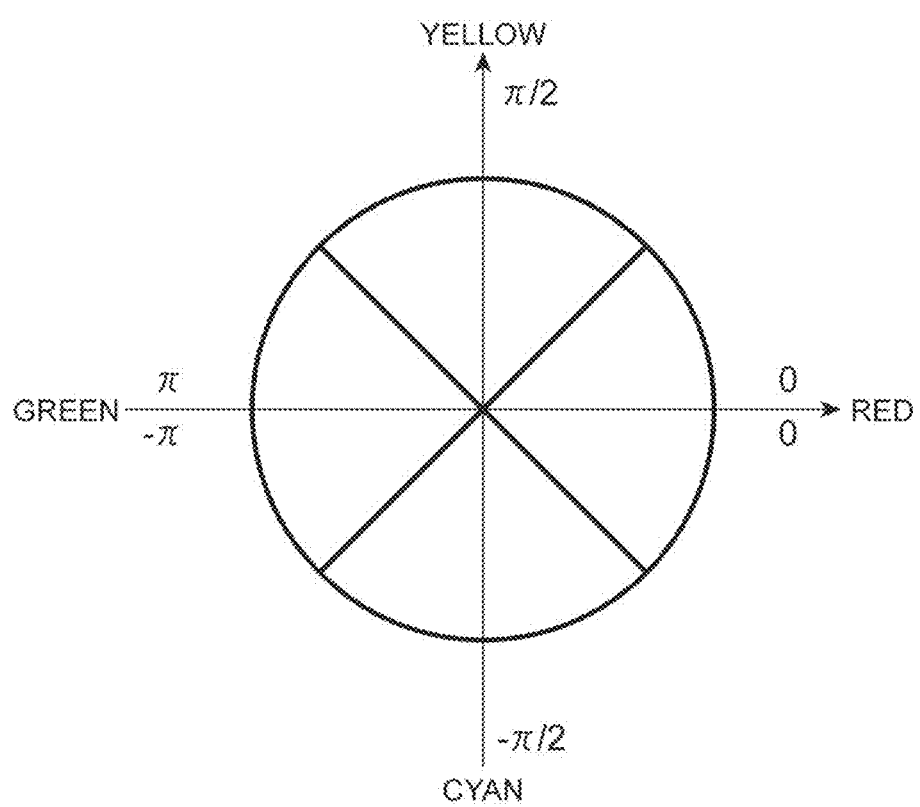
FIG. 11 is a diagram for describing color assignment in the electric current direction image.

The computer 24 maps the electric current direction image data for each reference pixel on the basis of the obtained electric current direction image data and position information of the reference pixel and generates the electric current direction image. The electric current direction image (refer to FIG. 10) of the present embodiment is an image obtained by mapping the electric current direction to a predetermined color according to the electric current direction. The correspondence relationship between the electric current direction and the color is determined by assigning different colors to angle ranges divided into a predetermined range. In the present embodiment, for example, as illustrated in FIG. 11, the different colors are assigned to the angle ranges divided into four ranges. In this example, "RED" is assigned to a range in which the electric current direction is from −π/4 to π/4. "YELLOW" is assigned to a range in which the electric current direction is from π/4 to 3π/4. "GREEN" is assigned to a range in which the electric current direction is from 3π/4 to π and −π3/4 to −π. In addition, "CYAN" is assigned to a range in which the electric current direction is from −3π/4 to −π/4. In this example, the colors indicating the directions opposite to each other are complementary colors (RED and GREEN, and YELLOW and CYAN). For example, the computer 24 may have a table in which the electric current direction and the color correspond to each other as illustrated in FIG. 12A. The table includes an angle table in which the electric current direction is defined as an angle and a color table in which the colors corresponding to the angle ranges are defined. For example, the angle table and the color table correspond one to one. In this case, the computer 24 is able to determine the color corresponding to the electric current direction by referring to the table.

For example, in a case in which the electric current in the reference pixel flows to the right in the image, the reference pixel is mapped with "RED" corresponding to the electric current direction 0. In a case in which the electric current in the reference pixel flows upward in the image, the reference pixel is mapped with "YELLOW" corresponding to the electric current direction π/2. In a case in which the electric current in the reference pixel flows to the left in the image, the reference pixel is mapped with "GREEN" corresponding to the electric current direction π or −π. In a case in which the electric current in the reference pixel flows downward in the image, the reference pixel is mapped with "CYAN" corresponding to the electric current direction −π/2. As illustrated in FIG. 10, in the electric current direction image, a region colored YELLOW and CYAN extends vertically in the image. In addition, a region colored RED and GREEN extends horizontally in the image. In addition, since a part seen as a marble shape is a region where an electric current path is not present, the part is randomly colored RED, YELLOW, GREEN, and CYAN.

[Generation of Electric Current Image]

Figure 13:
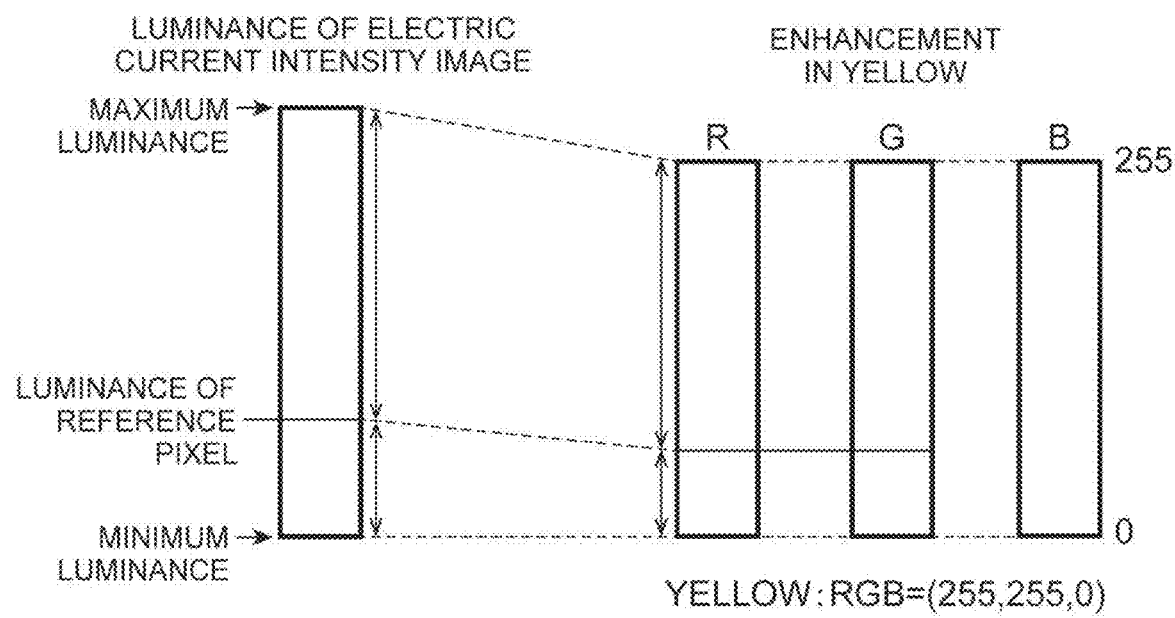
FIG. 13 is a diagram for describing contrast adjustment of the electric current direction image by the electric current intensity image.

The computer 24 generates the electric current image (electric current image data) showing the intensity and the direction of the electric current on the basis of the obtained electric current intensity image (electric current intensity image data) and the electric current direction image (electric current direction image data). For example, the electric current image is generated by synthesizing the electric current intensity image and the electric current direction image. In the generation of the electric current image, contrast enhancement by the luminance value of the electric current intensity image is added to the color forming the electric current direction image. That is, the color of the electric current direction image has the brightness according to the luminance value of the electric current intensity image. For example, the computer 24 refers to the color in the reference pixel from the electric current direction image and generates the brightness in the reference pixel from the luminance value of the electric current intensity image. For example, the brightness is generated by associating the maximum luminance value (65535) in the electric current intensity image with the maximum brightness (255) of the color and the minimum luminance value (0) with the minimum brightness (0). For example, as illustrated in FIG. 13, in a case in which the color of the reference pixel is "YELLOW" the brightness corresponding to the luminance value of the reference pixel is assigned. In this example, values of R and G which are color components constituting "YELLOW" in RGB are values according to the luminance values. That is, the values of R and G in the reference pixel are values obtained by multiplying the ratio of the luminance value of the reference pixel with respect to the maximum luminance value and 255. The electric current image is generated by mapping all of the reference pixels by the color to which the contrast enhancement is added. The electric current image may be displayed on the display device 25. In addition, in the example described above, the maximum luminance value in the electric current intensity image corresponds to the maximum brightness of the color and the minimum luminance value corresponds to the minimum brightness of the color, but the present invention is not limited thereto. The user may freely change the correspondence according to a luminance distribution of the electric current intensity image so that the recognition can be more easily performed by the user. For example, in a case in which the luminance of the electric current intensity image is more distributed in the maximum luminance value, the luminance value greater than the minimum luminance value may correspond to the minimum brightness. In addition, for example, in a case in which the luminance of the electric current intensity image is more distributed in the minimum luminance value, the luminance value less than the maximum luminance value may correspond to the maximum brightness.

Figure 14:
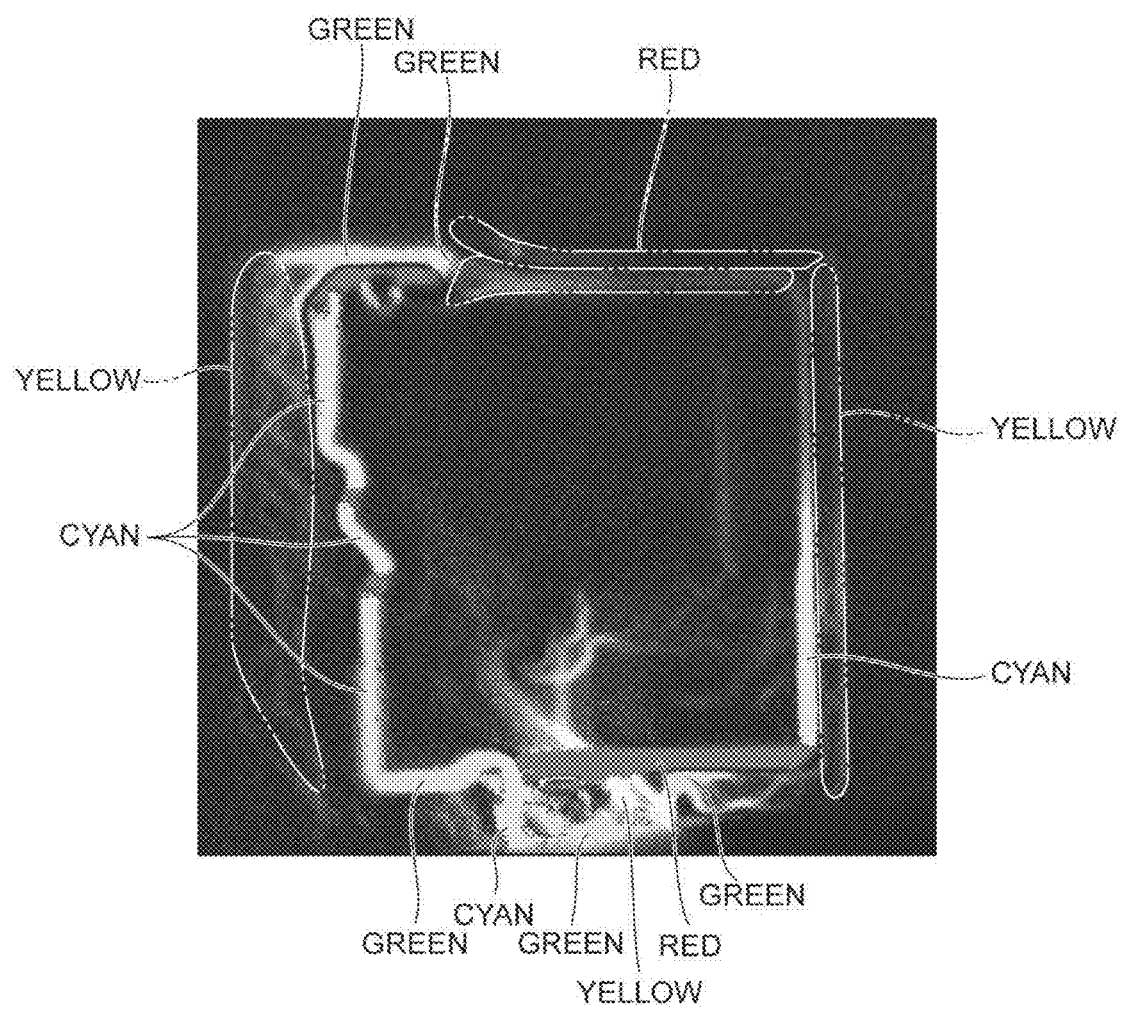
FIG. 14 is an image showing an example of an electric current image.

In the electric current image illustrated in FIG. 14, the color of a region where the electric current density is small (a part colored black in FIG. 9) in the electric current intensity image (refer to FIG. 9) is close to black. In addition, in a region where the electric current density is large (a part colored white in FIG. 9), the color of the electric current direction image is easily recognized. Therefore, it is easy to check the electric current flowing in the vertical direction (CYAN and YELLOW) and the electric current flowing in the horizontal direction (RED and GREEN) in the image, in comparison with the electric current direction image.

Figure 15:
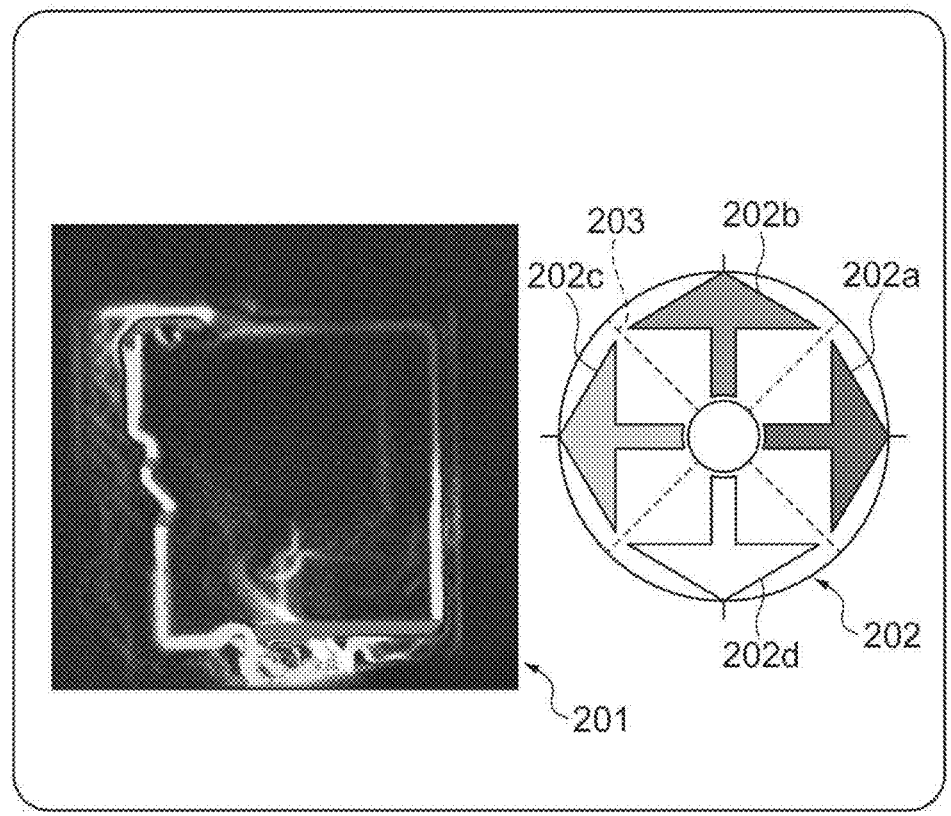
FIG. 15 is a diagram illustrating an example of a color arrangement adjustment screen.

In the present embodiment, it is possible to change (adjust) a color arrangement before and after generating the electric current image. As illustrated in FIG. 15, for example, the computer 24 displays an operation icon 202 on the display device 25 together with the generated electric current image 201. In the operation icon 202 of the illustrated example, four different arrow images 202a, 202b, 202c, and 202c are drawn in a circle. The arrow images 202a, 202b, 202c, and 202c are each colored differently. In addition, each of the arrow images 202a, 202b, 202c, and 202c shows a different direction. The respective colors and directions in the arrow images 202a, 202b, 202c, and 202c correspond to the relationship between the color and the electric current direction in the electric current direction image. Therefore, in a case of the correspondence relationship illustrated in FIG. 11 and FIG. 12A, the arrow image 202a indicating right is colored RED, the arrow image 202b indicating up is colored YELLOW, the arrow image 202c indicating left is colored GREEN and the arrow image 202d indicating down is colored CYAN. In addition, in the operation icon 202, a line 203 dividing the inside of the circle into the angle range of the electric current direction corresponding to each arrow image is drawn.

In a case in which there is an input (for example, an operation by a mouse or an input of a rotation angle) from the input device 26, the computer 24 rotates and displays the operation icon 202 according to the input operation. In addition, the computer 24 changes the correspondence relationship between the electric current direction and the color to correspond to the input operation. For example, in a case in which an initial state is a correspondence relationship illustrated in FIG. 12A, it is assumed that the operation icon 202 is rotated clockwise 90 degrees (−π/2) by the operation of the mouse. In this case, as illustrated in FIG. 12B, the table is updated to a state in which the color table is shifted −90 degrees with respect to the angle table. In addition, the computer 24 generates the electric current direction image by referring to the updated table. Therefore, the electric current image 201 changed to the updated color arrangement is displayed on the display device 25. The rotation operation of the operation icon 202 may be performed in a state in which the electric current intensity image or the electric current direction image is displayed on the display device 25. In addition, the electric current image 201 may be rotated by the input from the input device 26. In this case, the table may be updated according to the rotation angle of the electric current image 201. For example, in a case in which the electric current image 201 is rotated counterclockwise 90 degrees, the table is updated to the table illustrated in 12B.

Next, a modification example related to the generation of the electric current direction image and the electric current intensity image will be described. Instead of the method of generating the electric current direction image and the electric current intensity image in the embodiment described above, a method in the following modification example may be used. In addition, in the present embodiment, not only may the electric current image be generated by the method exemplified in the present specification but an electric current direction image and an electric current intensity image may also be generated by another method.

Figure 16A:
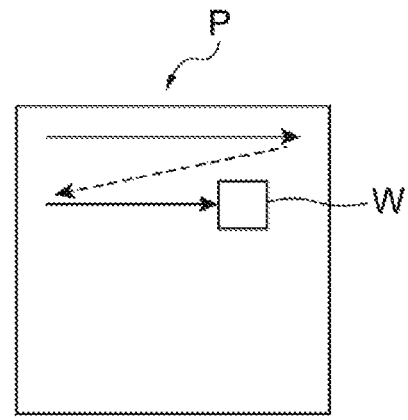
FIGS. 16A-16E are diagrams for describing a procedure for acquiring the electric current direction image.
Figure 16B:
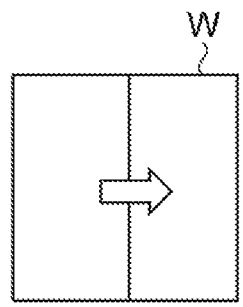

Modification Example 1 Related to Generation of Electric Current Direction Image The phase value in the phase image has a negative value on the right side of the reference pixel with respect to the electric current direction of the reference pixel and has a positive value on the left side of the reference pixel. Therefore, it is possible to obtain the electric current direction image by obtaining a gradient vector with respect to the direction of the negative phase value from the positive phase value in the phase image and rotating the gradient vector 90 degrees. As illustrated in FIG. 16A, in the modification example, a phase image P is scanned by a window region W of a predetermined size. In addition, the electric current direction at the center (reference pixel) of the window region is calculated within the range of the window region W. In the window region W, as illustrated in FIG. 16B, the window region W is divided into halves on the left and right sides and gradient vectors of the left and right are calculated. In a case in which the sum of the phase values of the left half is set to L and the sum of the phase values of the right half is set to R, a gradient x is obtained by expression (10).

[Math. 10]

$$x = R - L \qquad (10)$$

Figure 16D:
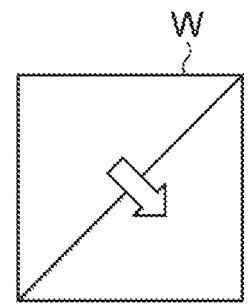
Figure 16C:
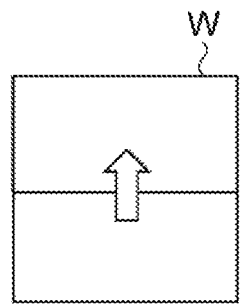

In addition, as illustrated in FIG. 16C, the window region W is divided into upper and lower halves and upper and lower gradient vectors are calculated. In a case in which the sum of the phase values of the upper half is set to T and the sum of the phase values of the lower half is set to B, the gradient y is obtained by expression (11).

[Math. 11]

$$y = B - T \qquad (11)$$

A two-dimensional gradient vector (x, y) is obtained from expressions (10) and (11). In the present modification example, in order to increase the accuracy of the calculated electric current direction image, a calculation is also performed in the diagonal direction.

As illustrated in FIG. 16D, the window region W is divided into halves in the upper left and the lower right and a gradient vector directed from the upper left to the lower right is calculated. In a case in which the sum of the phase values of the upper left half is set to LT and the sum of the phase values of the lower right half is set to RB, a gradient u is obtained by expression (12).

[Math. 12]

$$u = RB - LT \qquad (12)$$

Figure 16E:
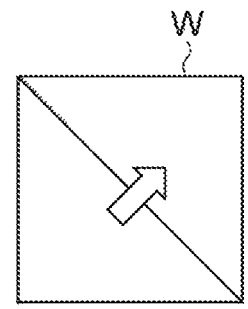

In addition, as illustrated in FIG. 16E, the window region W is divided into halves in the lower left and the upper right and a gradient vector directed from the lower left to the upper right is calculated. In a case in which the sum of the phase values of the lower left half is set to LB and the sum of the phase values of the upper right half is set to RT, a gradient v is obtained by expression (13).

[Math. 13]

$$v = LB - RT \qquad (13)$$

In addition, a two-dimensional gradient vector (u, v) is obtained from expressions (12) and (13). A two-dimensional gradient vector (u', v') is obtained by rotating the gradient vector (u, v) 45 degrees. A gradient vector (x+u', y+v') in the reference pixel is obtained by the two-dimensional gradient vector (u', v') and the two-dimensional gradient vector (x, y).

In addition, the gradient vector (x+u', y+v') is calculated as shown in expression (7). Since the gradient vector has a deviation of 90 degrees from the electric current direction, the electric current direction is obtained by expression (14). It is possible to obtain the electric current direction image by plotting the obtained electric current direction for each reference pixel.

[Math. 14]

$$\tan^{-1}\left(\frac{y+v'}{x+u'}\right) \pm \frac{\pi}{2} \qquad (14)$$

Modification Example 1 Related to Generation of Electric Current Intensity Image In this modification example, the electric current intensity image is generated on the basis of the Biot-Savart law similarly to the embodiment described above. Differently from the embodiment described above, in this modification example, a residual difference is minimized by a gradient method instead of using expression (4). That is, values of appropriate electric current densities $J_x$ and $J_y$ are substituted with respect to a formula derived from the Biot-Savart law and the magnetic flux density is calculated. The calculated magnetic flux is compared with the actual value and the electric current densities $J_x$ and $J_y$ of which the difference between the calculated magnetic flux and the actual value is the minimum are obtained. As the gradient method, a steepest descent method, a conjugate gradient method, or the like may be used. Hereinafter, a specific method will be described.

First, an amplitude image to which the Biot-Savart law may be applied (hereinafter referred to as "amplitude image modification b") is generated from the amplitude image and the phase image obtained by the measurement of the semiconductor device D. In a case in which the amplitude value in the reference pixel p=(x, y) is set to $a_p$ and the phase value in the reference pixel p=(x, y) is set to $\theta_p$, the amplitude image modification $b_p$ in the reference pixel p is obtained by expression (15).

[Math. 15]

$$b_p = a_p \cos(\theta_p + \alpha) \qquad (15)$$

In addition, the electric current direction obtained by "modification example 1 related to generation of electric current direction image" described above is set to φ and the electric current direction in the reference pixel p is set to $\varphi_p$. In addition, the amplitude image of the electric current density in the reference pixel p is set to $q_p$ and initialized with $q_p = 1.0$.

In addition, convolution is performed in an appropriate window region by the Biot-Savart law (expression (16)) indicated by the sum and the electric current density $J_x$ and $J_y$ indicated by expressions (17) and (18).

[Math. 16]

$$B_z(x, y) = \sum_{y'} \sum_{x'} \frac{J_x(x', y') \cdot (y - y') - J_y(x', y') \cdot (x - x')}{((x - x')^2 + (y - y')^2 + z^2)^{3/2}} \qquad (16)$$

[Math. 17]

$$J_x(p = (x', y')) = q_p \cos\varphi_p \qquad (17)$$

[Math. 18]

$$J_y(p = (x', y')) = q_p \sin\varphi_p \qquad (18)$$

Figure 17:
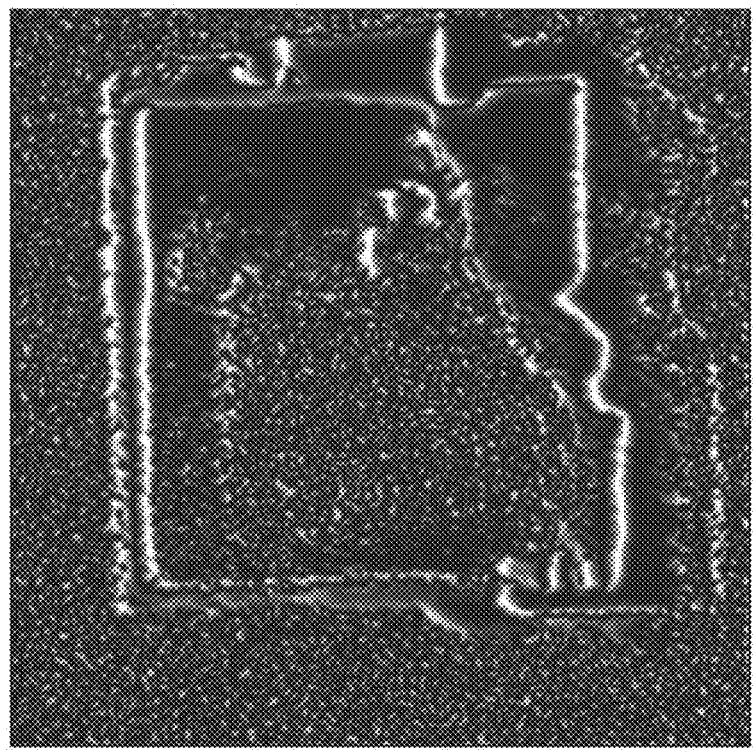
FIG. 17 is an image showing an example of the electric current intensity image.
Figure 18:
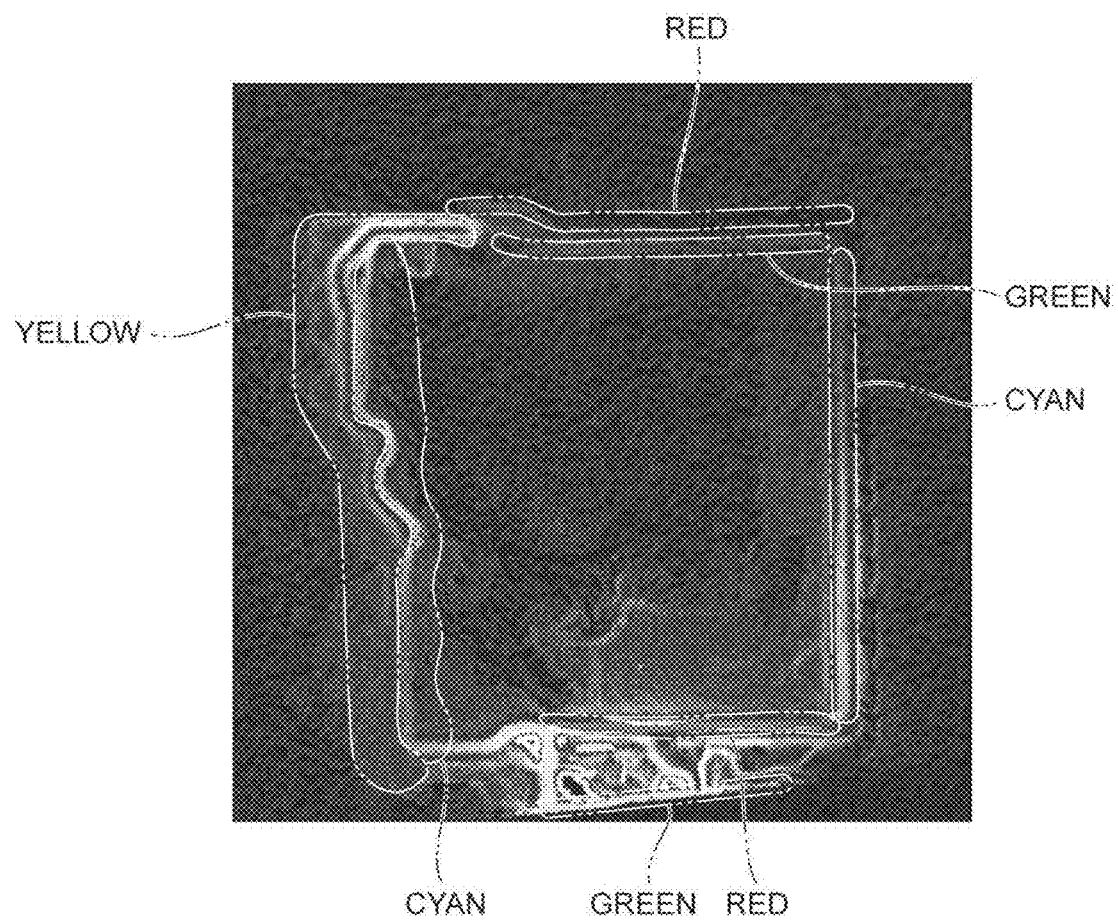
FIG. 18 is an image showing an example of the electric current image.

In a case in which the operation is set to A, it is possible to return to an inverse matrix problem. That is, it is possible to obtain the electric current intensity by obtaining q in expression (19). In addition, it is possible to obtain the electric current intensity image by plotting an absolute value of the obtained q as electric current intensity image data in the reference pixel. As illustrated in FIG. 17, in the electric current intensity image, similarly to the embodiment described above, the color of the electric current intensity image is close to white when the intensity of the electric current (electric current density) is higher. In addition, FIG. 18 is an electric current image obtained by synthesizing the present modification example and modification example 1 related to the generation of the electric current direction image described above. In the electric current image, similarly to the electric current image illustrated in FIG. 14, vertically flowing electric currents (CYAN and YELLOW) and horizontally flowing electric currents (RED and GREEN) may be checked.

[Math. 19]

$$Aq = b \qquad (19)$$

Figure 19A:
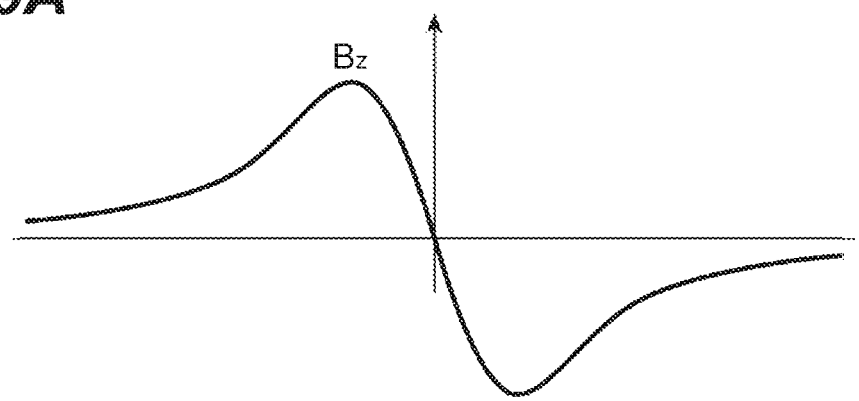
FIGS. 19A and 19B are diagrams for describing a procedure for acquiring the electric current intensity image.
Figure 19B:
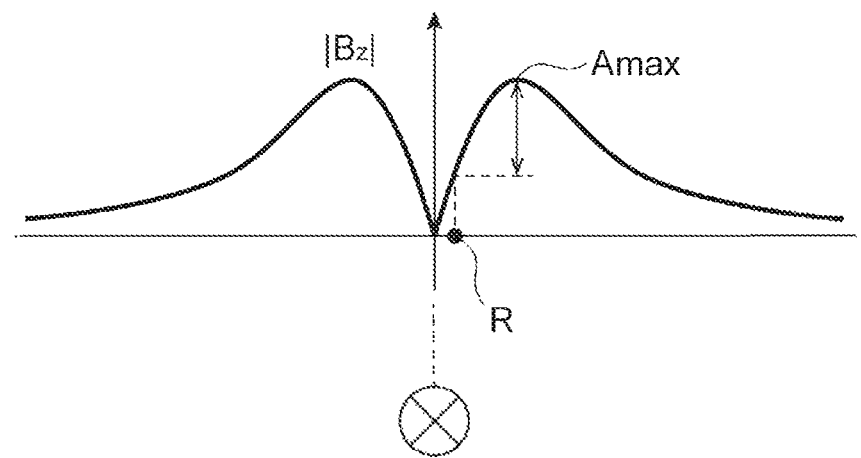
Figure 20:
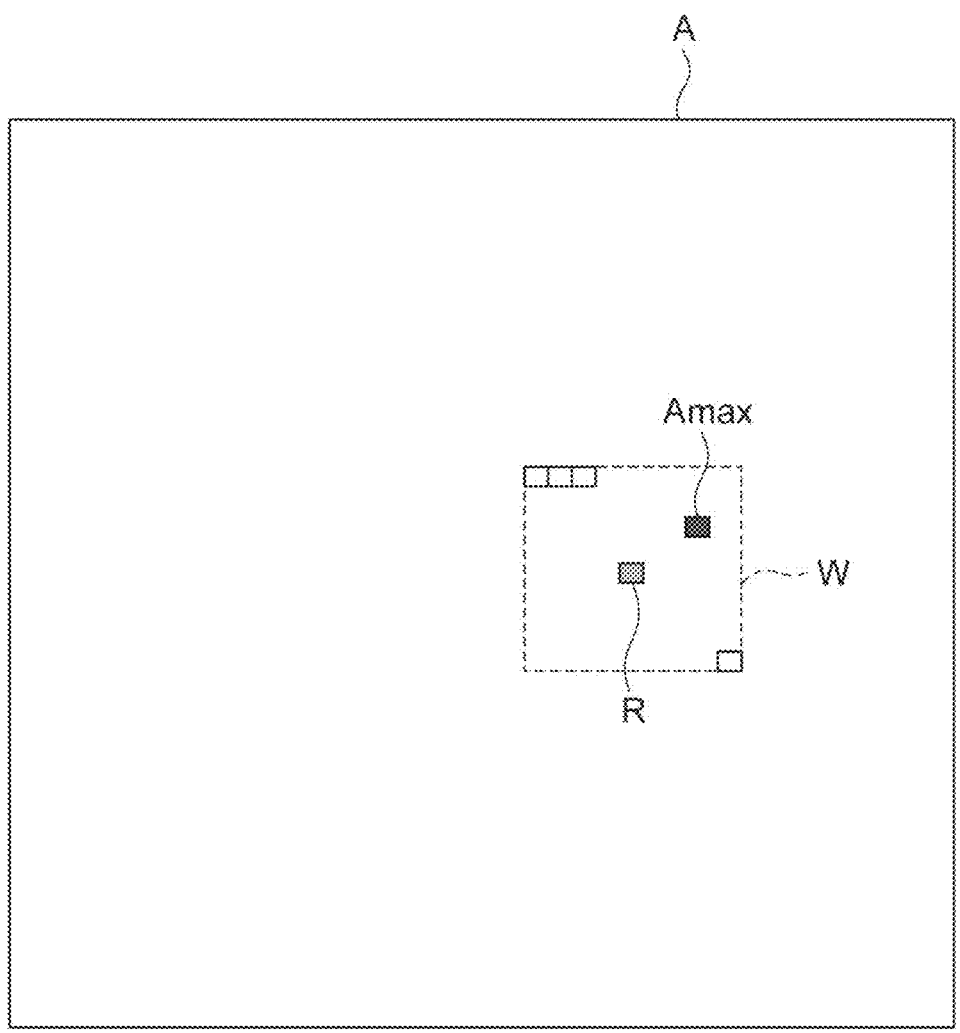
FIG. 20 is a diagram for describing a procedure for acquiring the electric current intensity image.
Figure 21:
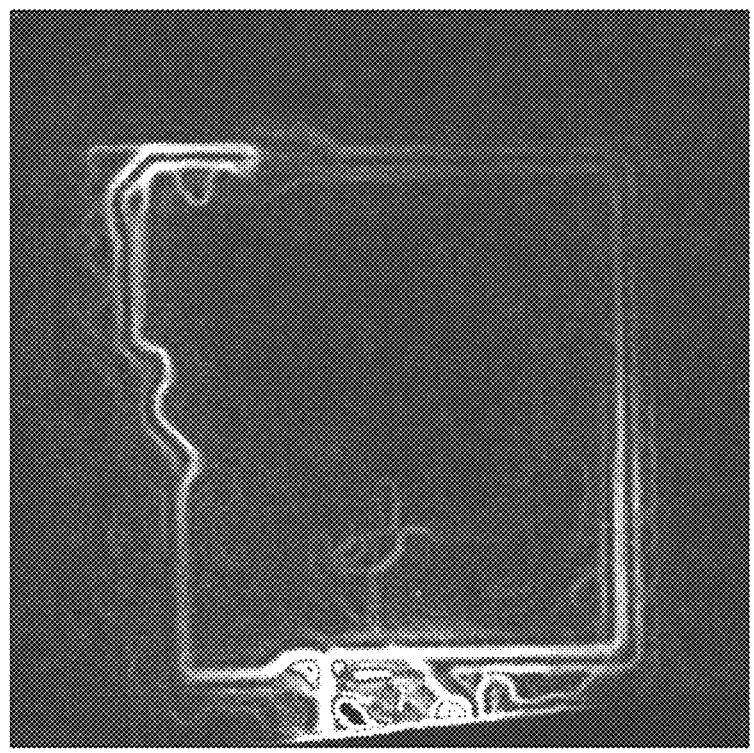
FIG. 21 is an image showing an example of the electric current intensity image.

Modification Example 2 Related to Generation of Electric Current Intensity Image In this modification example, the electric current intensity image is generated on the basis of a spatial distribution of the magnetic flux density by the Biot-Savart law. As illustrated in FIG. 19A, according to the spatial distribution of the magnetic flux density, the magnetic flux density is 0 directly above the position where the electric current flows and the maximum value and the minimum value are formed at the periphery (vicinity) of the position where the electric current flows. In the amplitude image obtained by observing the magnetic flux density, the magnetic flux density is obtained by an absolute value. In this case, as illustrated in FIG. 19B, when the maximum value of the electric current density in the position where the electric current flows in the vicinity thereof is set to Amax, the electric current density in the reference pixel R is a difference between the maximum value Amax and the amplitude value of the reference pixel R. Therefore, in this modification example, as illustrated in FIG. 20, the amplitude image A is scanned by the window region W of a predetermined size. The absolute value of the difference between the amplitude value in the reference pixel R (the center of the window region W) and the maximum amplitude value (Amax) within the window region W is the electric current intensity in the reference pixel. It is possible to obtain the electric current intensity image by plotting the obtained value as the electric current intensity image data in the reference pixel. As illustrated in FIG. 21, in the electric current intensity image, similarly to the embodiment described above, the color of the electric current intensity image is close to white when the intensity of the electric current (electric current density) is higher.

Figure 22:
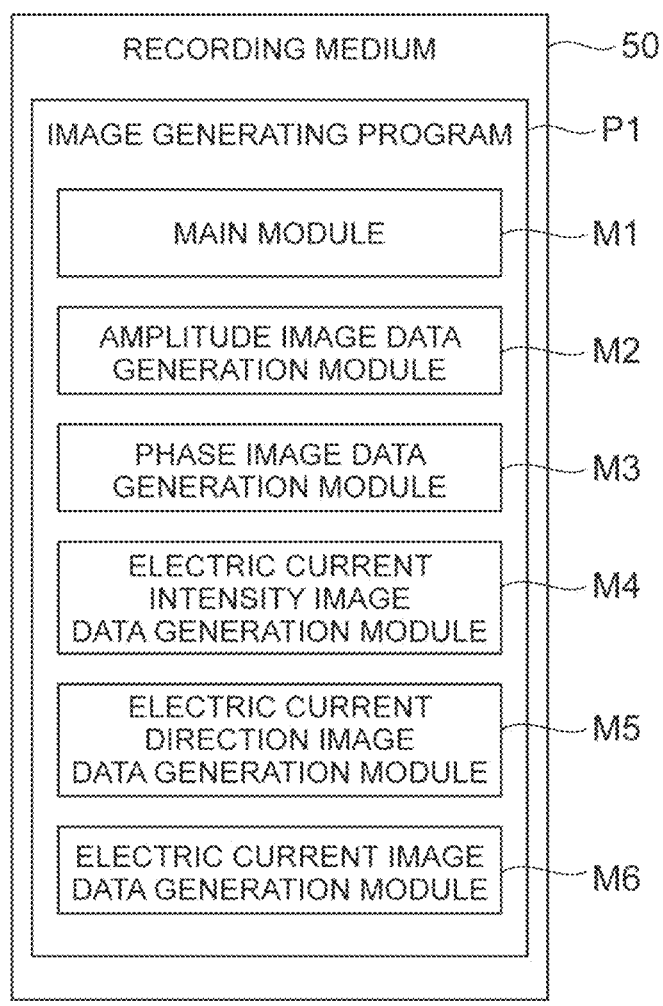
FIG. 22 is a diagram illustrating an example of a recording medium which records an image generating program.

Each process of generating the amplitude image, the phase image, the electric current intensity image, the electric current direction image, and the electric current image in the embodiment and each modification example described above may be executed by the computer 24 using, for example, an image generating program P1. As illustrated in FIG. 22, the image generating program P1 is recorded in a program recording region of a recording medium 50. For example, the recording medium 50 is constituted of a recording medium such as a CD-ROM, a DVD, and a ROM, or a semiconductor memory. The image generating program P1 includes a main module M1, an amplitude image data generation module M2, a phase image data generation module M3, an electric current intensity image data generation module M4, an electric current direction image data generation module M5, and an electric current image data generation module M6.

The main module M1 is a part generally controlling the image generation process, and causes the computer 24 to execute the amplitude image data generation module M2, the phase image data generation module M3, the electric current intensity image data generation module M4, the electric current direction image data generation module M5, and the electric current image data generation module M6. The computer 24 functions as an amplitude image data generation unit for generating the amplitude image (amplitude image data) by executing the amplitude image data generation module M2. In addition, the computer 24 functions as a phase image data generation unit for generating the phase image (phase image data) by executing the phase image data generation module M3. The computer 24 functions as an electric current intensity image data generation unit for generating the electric current intensity image (electric current intensity image data) by executing the electric current intensity image data generation module M4. The computer 24 functions as an electric current direction image data generation unit (image generation unit) for generating the electric current direction image (electric current direction image data) by executing the electric current direction image data generation module M5. The computer 24 functions as an electric current image data generation unit (image generation unit) for generating the electric current image (electric current image data) by executing the electric current image data generation module M6. In addition, the image generating program P1 may be provided as a computer data signal superimposed on a carrier wave via a communication network.

In the image generating method (image generating device 1) described above, magnetism is generated by the stimulation signal applied to the semiconductor device D. In addition, the phase image data including the phase component indicating the phase difference is generated on the basis of the phase difference between the reference signal generated on the basis of the stimulation signal and the detection signal based on the magnetism. Since the phase difference changes with the direction of the magnetic field, the phase image data includes information on the direction of the magnetic field. Since the direction of the magnetic field is determined by the direction of the electric current, it is possible to determine the direction of the electric current on the basis of the phase image data. Therefore, it is possible to generate the image showing the direction of the electric current using the determined direction of the electric current.

In addition, since the electric current direction image shows the direction of the electric current with a plurality of colors set (arranged) according to the direction, it is possible to visually ascertain the position and the direction of the electric current easily. In addition, the plurality of colors are different colors (RED, YELLOW, GREEN, and CYAN) set for (assigned to) each of the four angle ranges (90 degrees) divided to correspond to the direction of the electric current. The electric current path in the semiconductor device D is often designed in the X-axis direction and the Y-axis direction to be orthogonal in a plan view. In this case, the number of directions of the electric current is four, including the X direction, the –X direction, the Y direction, and the direction. Therefore, it is easy to distinguish the four directions because there are four different colors.

In addition, in the step of generating the electric current direction image, the correspondence relationship between the direction of the electric current and the plurality of colors may be changed. In the embodiment described above, the computer 24 includes the color table having color data of four colors and the angle table having data of an angle range divided into the four different angle ranges. In addition, the correspondence relationship between the color table and the angle table may be changed. According to this configuration, it is possible to easily adjust the color arrangement. In addition, even in a case in which the direction of the obtained image is tilted, it is possible to adjust the color arrangement according to the tilt by arbitrarily shifting setting the correspondence relationship between the color table and the angle table.

In addition, data in which magnetism direction data based on the phase image data is added to the intensity image data showing the intensity of the magnetism and generated from the detection signal is generated, and the electric current intensity image showing the intensity of the electric current is generated on the basis of the corresponding data. In addition, the electric current image showing the intensity and the direction of the electric current is generated on the basis of the electric current intensity image and the electric current direction image. The intensity of the magnetism corresponds to the magnitude of the electric current. Therefore, it is possible to express the magnitude and the direction of the electric current as the image by adding the magnetism direction data (electric current direction image) to the intensity image data (electric current intensity image).

Although an embodiment of the present invention has been described above, the present invention is not limited to the above described embodiment.

For example, although the reference signal has been described as being output from the tester unit 11, the present invention is not limited thereto, and the reference signal may be output from the semiconductor device D. In this case, the semiconductor device D may be directly connected to the frequency analysis unit 12 via the device control cable. In addition, the reference signal may be input to the frequency analysis unit 12 from the semiconductor device D via the tester unit 11. The reference signal according to the corresponding stimulation signal is output from the semiconductor device D to which the stimulation signal is applied and the corresponding reference signal is input to the frequency analysis unit 12.

In addition, although an example of the color arrangement in which the four different colors correspond to the four different angle ranges has been shown, the present invention is not limited thereto. The colors may be fewer than four colors or five or more colors. In addition, the divided angle range may vary with the colors. For example, the color arrangement may be performed is six colors of three colors each having a range of 90 degrees and three colors each having a range of 30 degrees. In addition, the relationship between the angle and the color indicating the electric current direction may be set as a gradation like a hue circle. In addition, the relationship between the angle and the color arrangement may be freely changeable by input means.

In addition, although an example in which the direction is indicated by the color has been shown, the present invention is not limited thereto. For example, an arrow indicating the electric current direction may be plotted with respect to the obtained electric current intensity image. In this case, the arrow may be plotted for each adjacent region having the same electric current direction. In addition, the arrow may be plotted with respect to only the region having the electric current density equal to or greater than a predetermined magnitude and the size of the arrow may correspond to the magnitude of the electric current intensity. In addition, for example, instead of a color, the electric current direction may be expressed by a dithering pattern or a geometric shape.

REFERENCE SIGNS LIST

1 . . . image generating device, 11 . . . tester unit (signal application unit), 13 . . . light source, 15 . . . optical scanner (irradiation optical system), 18 . . . MO crystal (magneto-optical crystal), 22 . . . light detector, 24 . . . computer (image generation unit)

The invention claimed is:

1. A method for generating an image which shows a direction of an electric current flowing through a semiconductor device, the method comprising:
applying a stimulation signal to the semiconductor device;
irradiating a magneto-optical crystal disposed to face the semiconductor device with light;
detecting light reflected from the magneto-optical crystal and outputting a detection signal;
generating phase image data based on a phase difference between the detection signal and a reference signal which is generated based on the stimulation signal;
generating an electric current direction image based on magnetism direction data in a thickness direction of the semiconductor device, derived from the phase image data,
generating an electric current intensity image by adding the magnetism direction data to intensity image data generated from the detection signal; and
generating an electric current image which shows intensity and the direction of the electric current with a plurality of colors set according to the direction based on the electric current intensity image and the electric current direction image.

2. The method of claim 1, wherein the plurality of colors are different colors set with respect to at least four angle ranges divided to correspond to the direction of the electric current.

3. The method of claim 1, wherein generating the electric current direction image comprises changing a correspondence relationship between the direction of the electric current and the plurality of colors.

4. The method of claim 1, wherein the plurality of colors indicate directions of electric current that are opposite to each other as complementary colors.

5. The method of claim 1, wherein generating the electric current image includes setting a correspondence relationship between the direction of the electric current and the plurality of colors as at least one of a gradation and a hue circle.

6. The method of claim 1, wherein the electric current intensity image and the electric current direction image are generated on the basis of the Biot-Savart law.

7. An image generating device for acquiring an image which shows a direction of an electric current flowing through a semiconductor device, the image generating device comprising:
a signal applicator configured to apply a stimulation signal to the semiconductor device;
a light source configured to generate light;
a magneto-optical crystal which is disposed to face the semiconductor device;
an irradiation optical system configured to irradiate the magneto-optical crystal with the light and guide light reflected from the magneto-optical crystal;
a light detector configured to detect the light reflected from the magneto-optical crystal and output a detection signal; and
a processor configured to:
generate phase image data based on a phase difference between the detection signal and a reference signal which is generated based on the stimulation signal,
generate an electric current direction image based on magnetism direction data in a thickness direction of the semiconductor device, derived from the phase image data,
generate an electric current intensity image by adding the magnetism direction data to intensity image data generated from the detection signal, and
generate an electric current image which shows intensity and the direction of the electric current with a plurality of colors set according to the direction based on the electric current intensity image and the electric current direction image.

8. The image generating device of claim 7, wherein the plurality of colors is different colors set with respect to at least four angle ranges divided to correspond to the direction of the electric current.

9. The image generating device of claim 7, wherein the processor is further configured to receive a color table comprising data of the plurality of colors and an angle table comprising data of the angle ranges divided to correspond to the direction of the electric current, and
    wherein the processor is further configured to change a correspondence relationship between the color table and the angle table.

10. The image generating device of claim 7, wherein the plurality of colors indicate directions of electric current that are opposite to each other as complementary colors.

11. The image generating device of claim 7, wherein the processor is further configured to set a correspondence relationship between the direction of the electric current and the plurality of colors as at least one of a gradation and a hue circle.

12. The image generating device of claim 7, wherein the processor is further configured to generate the electric current intensity image and the electric current direction image on the basis of the Biot-Savart law.

13. A non-transitory computer-readable recording medium recording an image generating program for causing a computer to execute a process of acquiring an image showing a direction of an electric current flowing through a semiconductor device by applying a stimulation signal to the semiconductor device, the image generating program causing a computer to:
    generate phase image data based on the phase difference between a detection signal based on a magnetism generated by application of the stimulation signal and a reference signal generated based on the stimulation signal;
    generate an electric current direction image based on magnetism direction data in a thickness direction of the semiconductor device, derived from the phase image data;
    generate an electric current intensity image by adding the magnetism direction data to intensity image data generated from the detection signal; and
    generate an electric current image which shows the intensity and the direction of the electric current with a plurality of colors set according to the direction based on the electric current intensity image and the electric current direction image.

\* \* \* \* \*